United States Patent
Na et al.

(10) Patent No.: US 10,636,793 B2
(45) Date of Patent: Apr. 28, 2020

(54) FINFETS HAVING ELECTRICALLY INSULATING DIFFUSION BREAK REGIONS THEREIN AND METHODS OF FORMING SAME

(71) Applicant: Samsung Electronics Co., Ltd., Suwon-si, Gyeonggi-do (KR)

(72) Inventors: Hyung Joo Na, Hwaseong-si (KR); Ju Youn Kim, Hwaseong-si (KR); Bong Seok Suh, Hwaseong-si (KR); Sang Min Yoo, Hwaseong-si (KR); Joo Ho Jung, Hwaseong-si (KR); Eui Chul Hwang, Hwaseong-si (KR); Sung Moon Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/204,095

(22) Filed: Nov. 29, 2018

(65) Prior Publication Data
US 2019/0393220 A1    Dec. 26, 2019

(30) Foreign Application Priority Data
Jun. 20, 2018 (KR) .......................... 10-2018-0070805

(51) Int. Cl.
*H01L 21/70* (2006.01)
*H01L 27/092* (2006.01)
(Continued)

(52) U.S. Cl.
CPC ...... *H01L 27/0924* (2013.01); *H01L 21/0337* (2013.01); *H01L 21/823821* (2013.01);
(Continued)

(58) Field of Classification Search
CPC .......... H01L 27/0924; H01L 29/66795; H01L 21/823821; H01L 29/0649;
(Continued)

(56) References Cited

U.S. PATENT DOCUMENTS 9,373,624 B1   6/2016   Balakrishnan et al.
9,406,676 B2   8/2016   Yu et al.
(Continued)

FOREIGN PATENT DOCUMENTS

KR   10-2016-0115019   10/2016
KR   10-2017-0104282   9/2017

*Primary Examiner* — Vu A Vu
(74) *Attorney, Agent, or Firm* — Myers Bigel, P.A.

(57) ABSTRACT

A FINFET includes a first fin extending in a first direction on a substrate and, a second fin extending in the first direction and spaced apart from the first fin in the first direction. A third fin is provided with a long side shorter than long sides of the first fin and the second fin and is disposed between the first fin and the second fin. A first gate structure extends in a second direction different from the first direction and crosses the first fin. A device isolation layer is disposed on a lower sidewall of each of the first, second and third fins and is formed to extend in the first direction. An electrically insulating diffusion break region includes a first portion crossing between the first fin and the third fin, a second portion crossing between the second fin and the third fin, and a third portion disposed between the first portion and the second portion on the third fin. The diffusion break region extends in the second direction on the device isolation layer. A level of a lower surface of the third portion is higher than a level of a lower end of each of the first portion and the second portion and is lower than a level of an upper surface of the first gate structure.

18 Claims, 25 Drawing Sheets

(51) Int. Cl.
*H01L 29/66* (2006.01)
*H01L 29/78* (2006.01)
*H01L 21/033* (2006.01)
*H01L 29/06* (2006.01)
*H01L 21/8238* (2006.01)
*H01L 29/08* (2006.01)

(52) U.S. Cl.
CPC ........ *H01L 21/823864* (2013.01); *H01L 21/823878* (2013.01); *H01L 29/0649* (2013.01); *H01L 29/0847* (2013.01); *H01L 29/6656* (2013.01); *H01L 29/66545* (2013.01); *H01L 29/66795* (2013.01); *H01L 29/7851* (2013.01)

(58) Field of Classification Search
CPC ....... H01L 21/823864; H01L 29/66545; H01L 21/0337; H01L 29/0847; H01L 29/7851; H01L 21/823878; H01L 29/6656

USPC ...................................................... 257/369
See application file for complete search history.

(56) References Cited

U.S. PATENT DOCUMENTS

| | | |
|---|---|---|
| 9,529,956 B2 | 12/2016 | Liao et al. |
| 9,761,495 B1 | 9/2017 | Xie et al. |
| 9,842,778 B2 | 12/2017 | You et al. |
| 9,865,704 B2 | 1/2018 | Xie et al. |
| 2016/0284706 A1 | 9/2016 | Chung et al. |
| 2017/0200651 A1 | 7/2017 | Lee et al. |
| 2017/0256645 A1 | 9/2017 | Chung et al. |
| 2017/0365674 A1 | 12/2017 | Lee et al. |
| 2017/0371995 A1 | 12/2017 | Correale et al. |
| 2019/0006345 A1* | 1/2019 | Wang ................. H01L 27/0207 |

* cited by examiner

FINFETS HAVING ELECTRICALLY INSULATING DIFFUSION BREAK REGIONS THEREIN AND METHODS OF FORMING SAME

REFERENCE TO PRIORITY APPLICATION

This application claims priority from Korean Patent Application No. 10-2018-0070805, filed Jun. 20, 2018, the disclosure of which is hereby incorporated herein by reference in its entirety.

BACKGROUND

1. Field

Devices and methods consistent with exemplary embodiments relate to three-dimensional semiconductor devices and methods of forming same.

2. Description of Related Art

As semiconductor devices become more highly integrated, it becomes increasingly difficult to realize the high performance of transistors required by users. To overcome such difficulties, various field-effect transistor structures have been proposed. For example, a high dielectric film-metal gate structure has been proposed to replace a conventional field-effect transistor in which silicon oxide and polycrystalline silicon are used in a gate insulating layer and a gate electrode material, respectively.

SUMMARY

The exemplary embodiments of the inventive concept are directed to providing integrated circuits having FINFETs therein with improved performance. In addition, the exemplary embodiments of the inventive concept are directed to providing FINFETs having device characteristics that are less susceptible to variation.

According to exemplary embodiments, there is provided a semiconductor device including a first fin formed to extend in a first direction on a substrate, a second fin formed to extend in the same first direction and spaced apart from the first fin in the first direction, and a third fin including a long side shorter than long sides of the first fin and the second fin and disposed between the first fin and the second fin. A first gate structure is also provided, which extends in a second direction different from the first direction and crosses the first fin. A device isolation layer is also provided, which is disposed on a lower sidewall of each of the first, second and third fins and extends in the first direction. An electrically insulating diffusion break region is provided, which includes a first portion crossing between the first fin and the third fin, a second portion crossing between the second fin and the third fin, and a third portion disposed between the first portion and the second portion on the third fin. The diffusion break region is formed to extend in the second direction on the device isolation layer. In addition, a level of a lower surface of the third portion is preferably higher than a level of a lower end of each of the first portion and the second portion, and is preferably lower than a level of an upper surface of the first gate structure.

According to additional exemplary embodiments, there is provided a semiconductor device including a first fin extending in a first direction on a substrate, and a second fin formed to extend in the first direction and spaced apart from the first fin in the first direction. A first gate structure is provided, which extends in a second direction different from the first direction and crosses the first fin. A device isolation layer is provided, which is disposed on a lower sidewall of each of the first fin and the second fin, and extends in the first direction. A diffusion break region is provided, which extends in the second direction across an area between the first fin and the second fin. Spacers are provided on corresponding sidewalls of the diffusion break region. Preferably, a width of a portion of the diffusion break region extending between the spacers is twice or more than a width of the first gate structure.

According to further exemplary embodiments, there is provided a semiconductor device including a first fin extending in a first direction on a substrate, a second fin extending in the first direction and spaced apart from the first fin in the first direction. A device isolation layer is provided, which is disposed on a lower sidewall of each of the first fin and the second fin and extends in the first direction. A first diffusion break region is provided, which extends in a second direction crossing the first direction across an area between the first fin and the second fin and the device isolation layer. A second diffusion break region is provided, which is disposed to overlap the first diffusion break region in a plan view thereof and includes portions extending into the first diffusion break region.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EXEMPLARY EMBODIMENTS

Hereinafter, a semiconductor device and a method of manufacturing the same according to exemplary embodiments of the inventive concept will be described with reference to the accompanying drawings.

Figure 1:
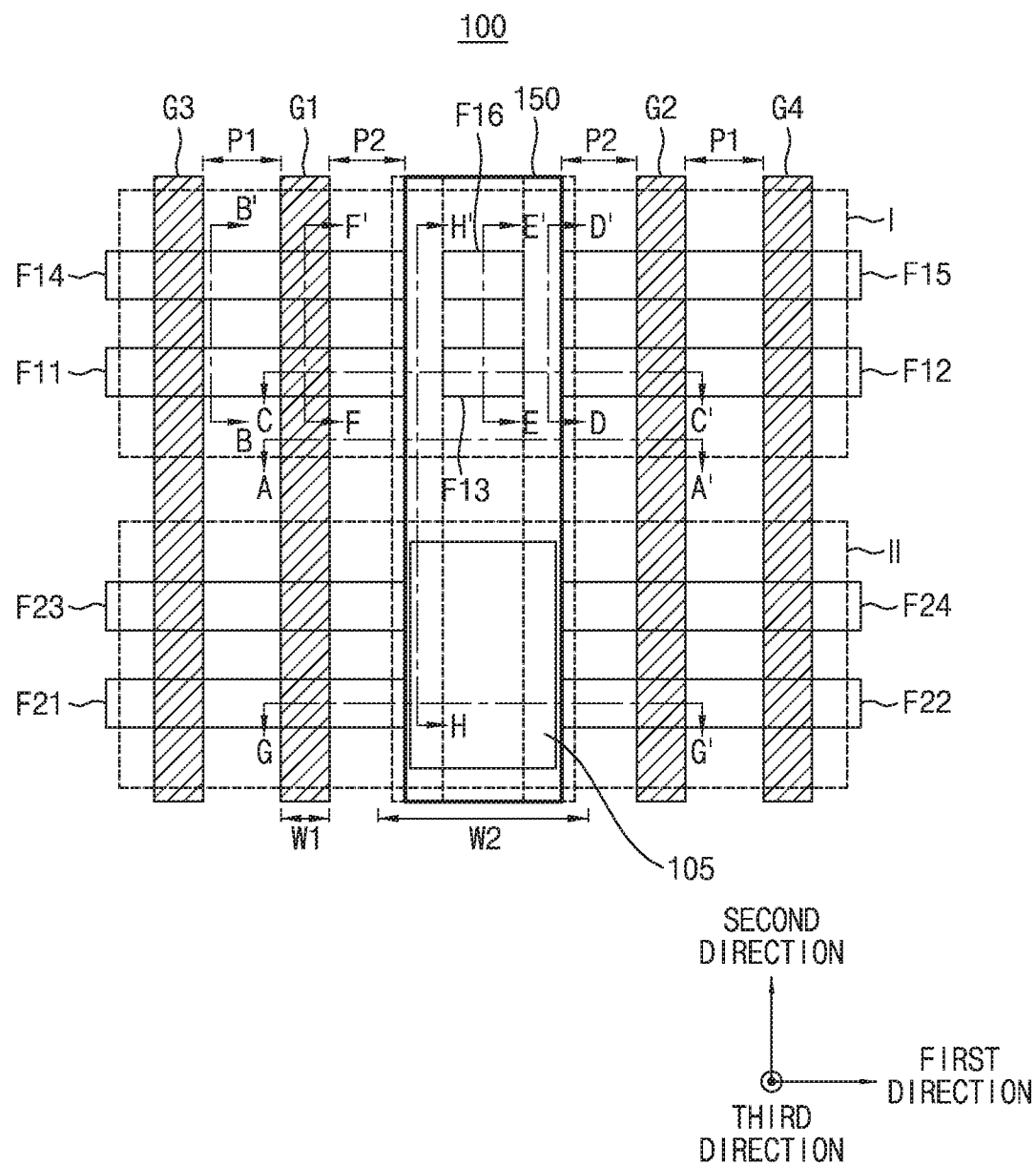
FIG. 1 is a schematic layout of some regions of a semiconductor device according to an exemplary embodiment of the inventive concept.
Figure 2:
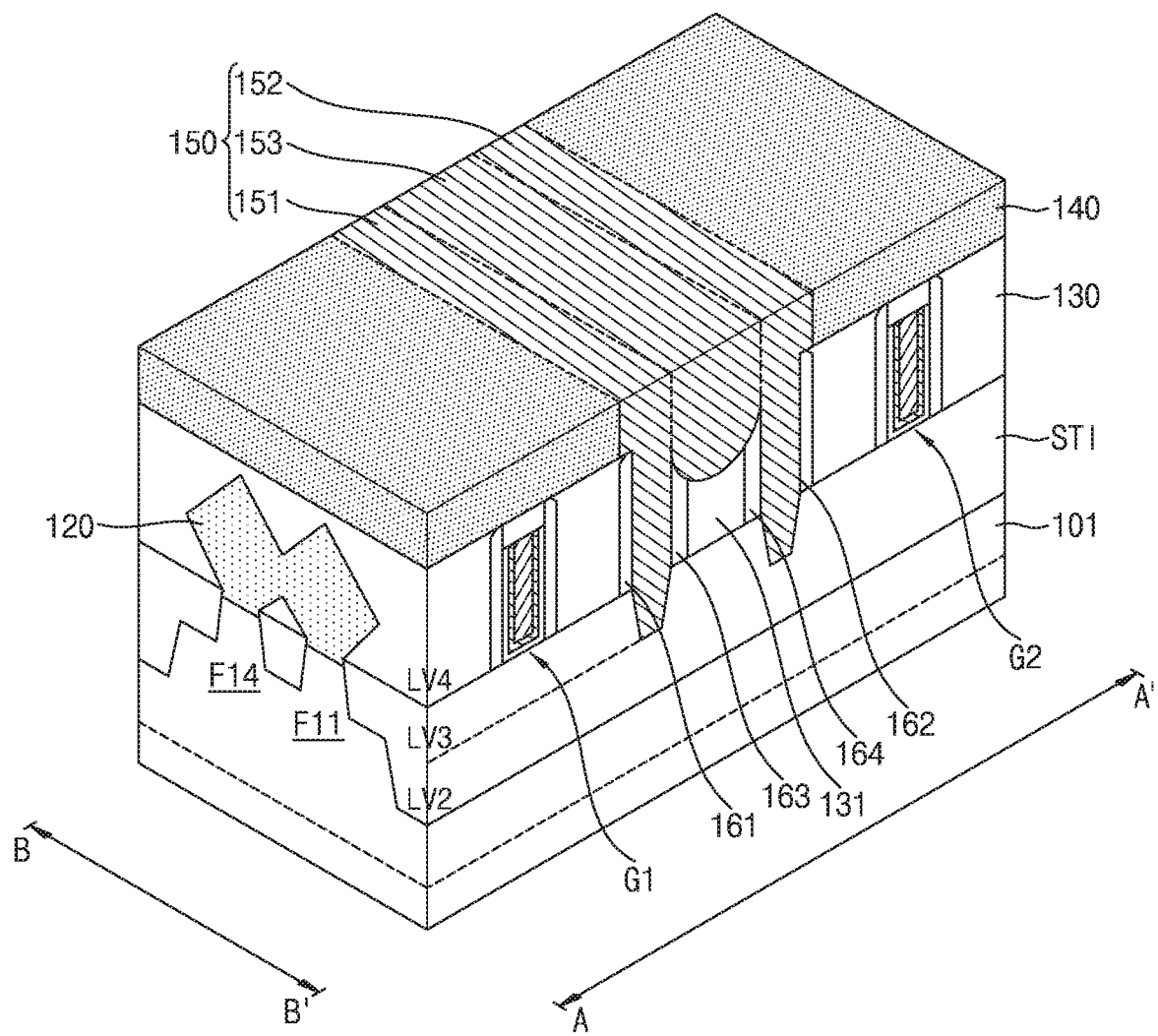
FIG. 2 is a perspective view showing vertical cross sections taken along lines A-A' and B-B' of FIG. 1.
Figure 3A:
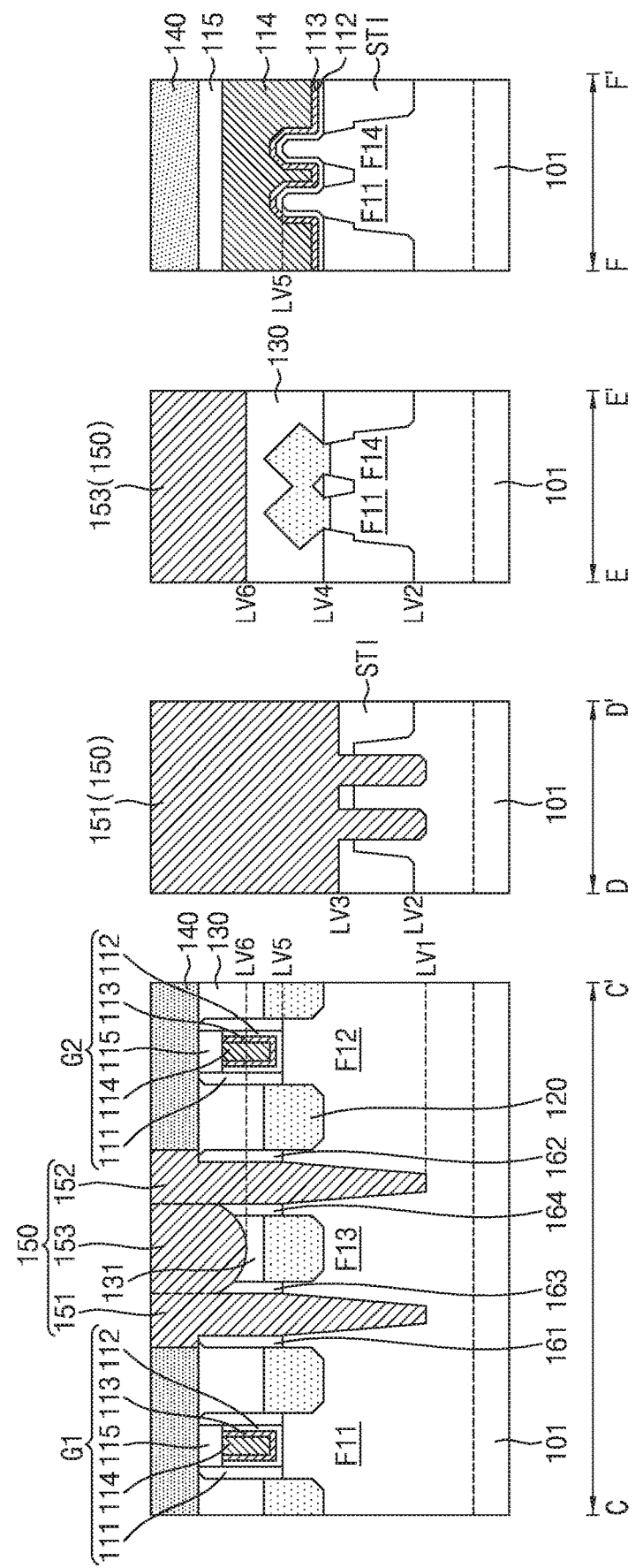
FIG. 3A shows vertical cross-sectional views taken along lines C-C', D-D', E-E', and F-F' of FIG. 1.
Figure 3B:
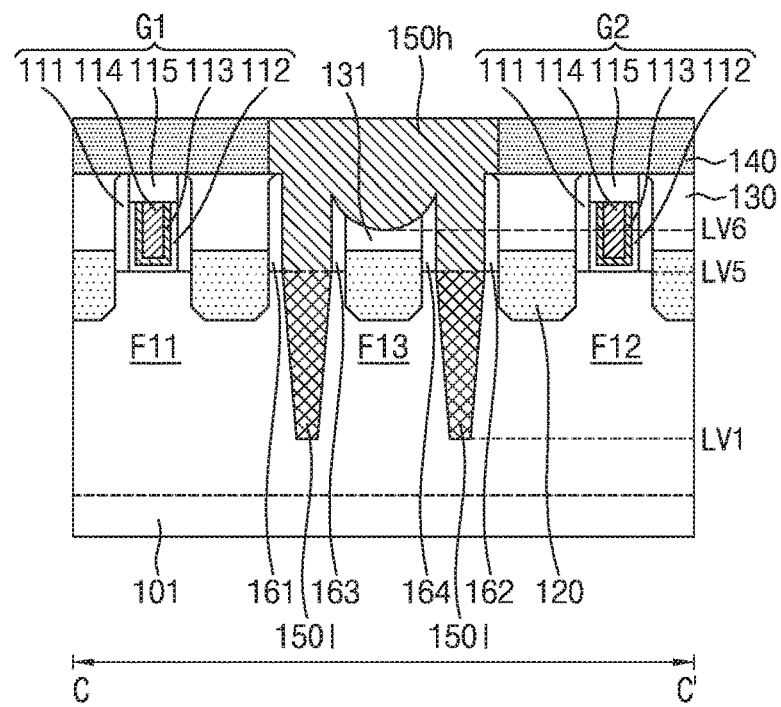
FIG. 3B is a vertical cross-sectional view of a semiconductor device according to an exemplary embodiment of the inventive concept, which is taken along line C-C' shown in FIG. 1.
Figure 4:
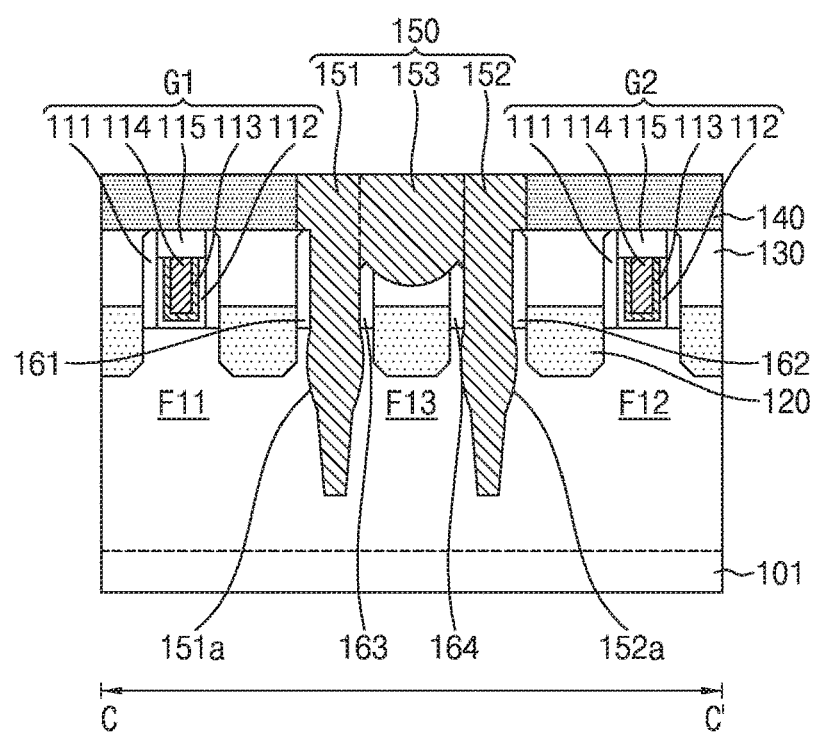
FIG. 4 is a vertical cross-sectional view of a semiconductor device according to an exemplary embodiment of the inventive concept, which is taken along line C-C' shown in FIG. 1.

FIG. 1 is a schematic layout of some regions of a semiconductor device according to an exemplary embodiment of the inventive concept. FIG. 2 is a perspective view showing vertical cross sections taken along lines A-A' and B-B' of FIG. 1. FIG. 3A shows vertical cross-sectional views taken along lines C-C', D-D', E-E', and F-F' of FIG. 1. FIG. 3B is a vertical cross-sectional view of a semiconductor device according to an exemplary embodiment of the inventive concept, which is taken along line C-C' shown in FIG. 1. FIG. 4 is a vertical cross-sectional view of a semiconductor device according to an exemplary embodiment of the inventive concept, which is taken along line C-C' shown in FIG. 1.

Referring to FIGS. 1 through 3A, a semiconductor device 100 according to the exemplary embodiment of the inventive concept may include a substrate 101, fins F11 to F16 and F21 to F24, a device isolation layer STI, gate structures G1, G2, G3, and G4, source/drain regions 120, an interlayer insulating layer 130, a mask layer 140, a diffusion break region 150, and spacers 161 to 164.

The substrate 101 may include a semiconductor material such as silicon or germanium. For example, the substrate 101 may be made of one or more materials selected from Si, Ge, SiGe, GaP, GaAs, SiC, SiGeC, InAs, and InP. However, the substrate 101 according to the exemplary embodiment of the inventive concept is not limited to the above-described examples. In one embodiment, the substrate 101 may be a silicon-on-insulator (SOI) substrate 101.

The substrate 101 may include a first region I and a second region II. For example, the first region I may be a p-channel metal-oxide-semiconductor (PMOS) region and the second region II may be an n-channel metal-oxide-semiconductor (NMOS) region, but the inventive concept is not limited thereto.

The fins F11 to F16 and F21 to F24 may include first fins F11, F14, F21, and F23 second fins F12, F15, F22 and F24 and third fins F13 and F16. The fins F11 to F16 and F21 to F24 may protrude from the substrate 101 in a direction perpendicular to a main surface of the substrate 101. The fins F11 to F16 and F21 to F24 may be spaced apart from each other in a first direction and a second direction. The fins F11 to F16 and F21 to F24 may extend in the first direction. In the first region I, first to third fins F11 to F16 may be formed in parallel to each other in a longitudinal direction. That is, the first to third fins F11 to F16 may be collinear (e.g., the first fin F11, the second fin F12, and the third fin F13 may be collinear, and the first fin F14, the second fin F15 and the third fin F16 may be collinear). In the second region II, the first fins F21 and F23 and the second fins F22 and F24 may be collinear (e.g., the first fin F21 and the second fin F22 may be collinear, and the first fin F23 and the second fin F24 may be collinear). The third fins F13 and F16 may not be formed in the second region II. Further, the third fins F13 and F16 may also not be formed in the first region I.

Each of the fins F11 to F16 and F21 to F24 may include a long side formed in the first direction and a short side formed in the second direction. The fact that the first to third fins F11 to F16 are parallel to each other in the longitudinal direction means that the short sides of the first fins F11 and F14 and the short sides of the second fins F12 and F15 face each other and the short sides of the second fins F12 and F15 and the short sides of the third fins F13 and F16 face each other.

Lengths of the long sides of the third fins F13 and F16 may be shorter than lengths of the long sides of the first fins F11 and F14 and the second fins F12 and F15. That is, lengths of the third fins F13 and F16 in the first direction may be shorter than lengths of the first fins F11 and F14 or the second fins F12 and F15 in the first direction.

The fins F11 to F16 and F21 to F24 may be portions of the substrate 101 and may include an epitaxial layer grown from the substrate 101. In one embodiment, the fins F11 to F16 and F21 to F24 may include a semiconductor material. For example, the fins F11 to F16 and F21 to F24 may include Si, SiGe, or the like. In one exemplary embodiment, the fins F11 to F16 and F21 to F24 may include the same material as the substrate 101. For example, when the substrate 101 includes Si, the fins F11 to F16 and F21 to F24 may also include Si. However, the inventive concept is not limited thereto, and the substrate 101 and the fins F11 to F16 and F21 to F24 may include different materials.

The device isolation layer STI may be formed on the substrate 101 to cover portions of sidewalls of the fins F11 to F16 and F21 to F24 and expose upper portions of the fins F11 to F16 and F21 to F24. The device isolation layer STI may extend in the first direction along the long sides of the fins F11 to F16 and F21 to F24. For example, the device isolation layer STI may include any one of an oxide film, an oxynitride film, and a nitride film, but the inventive concept is not limited thereto.

The gate structures G1, G2, G3, and G4 may include first to fourth gate structures. The gate structures G1, G2, G3, and G4 may extend on the fins F11 to F16 and F21 to F24 in the second direction crossing the first direction in which the fins F11 to F16 and F21 to F24 extend. The gate structures G1, G2, G3, and G4 may be spaced apart from each other in the first direction. The gate structures G1, G2, G3, and G4 may be formed to be disposed on the device isolation layer STI.

Each of the gate structures G1, G2, G3, and G4 may include gate electrodes 113 and 114, a gate insulating layer 112, gate spacers 111, and a gate capping layer 115.

The gate electrodes 113 and 114 may be stacked in two or more layers. In one exemplary embodiment, the gate electrodes 113 and 114 may include a first gate metal layer 113 and a second gate metal layer 114. The first gate metal layer 113 may serve to adjust a work function and the second gate metal layer 114 may serve to fill a space formed by the first gate metal layer 113. Further, the first gate metal layer 113 may include, for example, at least one of TiN, WN, TiAl, TiAlN, TaN, TiC, TaC, TaCN, TaSiN, and a combination thereof, but the inventive concept is not limited thereto. Further, the second gate metal layer 114 may include, for example, at least one of W, Al, Cu, Co, Ti, Ta, poly-Si, SiGe, and a metal alloy, but the inventive concept is not limited thereto. The gate electrodes 113 and 114 may be formed by, for example, a replacement process (or a gate last process), but the inventive concept is not limited thereto.

The gate insulating layer 112 may be formed between the gate electrodes 113 and 114 and the fins F11 to F16 and F21 to F24. Further, the gate insulating layer 112 may be formed between the gate electrodes 113 and 114 and the device isolation layer STI. The gate insulating layer 112 may extend in the second direction along profiles of the fins F11 to F16 and F21 to F24 protruding upward from the device isolation layer STI. The gate insulating layer 112 may be formed to have a shape extending in a third direction along side surfaces of the gate electrodes 113 and 114.

The gate insulating layer 112 may include a high dielectric material having a higher dielectric constant than a silicon oxide film. For example, the gate insulating layer 112 may include $HfO_2$, $ZrO_2$, LaO, $Al_2O_3$, $Ta_2O_5$, or the like, but the inventive concept is not limited thereto.

The gate spacers 111 may be disposed at both sides of each of the gate electrodes 113 and 114 extending in the second direction. The gate spacers 111 may include a nitride film. For example, the gate spacers 111 may include silicon nitride. However, the inventive concept is not limited thereto, and the gate spacers 111 may include at least one of silicon oxynitride, silicon oxide, and silicon oxycarbonitride, and a combination thereof.

The gate capping layer 115 may be disposed on the gate electrodes 113 and 114. The gate capping layer 115 may extend in the second direction. An upper surface of the gate capping layer 115 may be substantially coplanar with an upper surface of the gate spacer 111. In other words, a height of the upper surface of the gate capping layer and a height of the upper surface of the gate spacer 111 may be substantially identical to each other.

For example, the gate capping layer 115 may include at least one of a silicon nitride film and a silicon oxynitride film, but the inventive concept is not limited thereto. Further, in some exemplary embodiments, the gate capping layer 115 may be omitted as necessary.

The source/drain regions 120 may be disposed at both sides of the gate structures G1, G2, G3, and G4. The source/drain regions 120 may be disposed in the fins F11 to F16 and F21 to F24. That is, the source/drain regions 120 may be formed in some etched regions of the fins F11 to F16 and F21 to F24. In FIG. 3A, the source/drain regions 120 are shown as being in contact with each other in the second direction, but the inventive concept is not limited thereto, and the source/drain regions 120 may be spaced apart from each other in the second direction. In one exemplary embodiment, the source/drain regions 120 may be elevated source/drain regions 120. Accordingly, upper surfaces of the source/drain regions 120 may be at a higher level than upper surfaces of the fins F11 to F16 and F21 to F24.

In one exemplary embodiment, when the semiconductor device is a PMOS transistor, the source/drain regions 120 may include a compressive stress material. For example, the compressive stress material may be a material having a larger lattice constant than Si, for example, SiGe. The compressive stress material may increase the mobility of carriers in a channel region by applying a compressive stress to the fins F11 to F16 and F21 to F24 below the gate structures, that is, to the channel region. Meanwhile, when the semiconductor device is an NMOS transistor, the source/drain regions 120 may include the same material as the substrate 101 or a tensile stress material. For example, when the substrate 101 includes Si, the source/drain regions 120 may include Si or a material (e.g., SiC or SiP) having a smaller lattice constant than Si. The tensile stress material may increase the mobility of carriers in a channel region by applying a tensile stress to the fins F11 to F16 and F21 to F24 below the gate structures, that is, to the channel region.

In one exemplary embodiment, the source/drain regions 120 may be formed by epitaxial growth, but the inventive concept is not limited thereto. Although not shown in the drawing, a silicide film may be formed on the source/drain regions 120. The silicide film may be formed along the upper surfaces of the source/drain regions 120. The silicide film may serve to reduce sheet resistance, contact resistance, or the like when the source/drain regions 120 are brought into contact with contacts. The silicide film may include a conductive material, for example, Pt, Ni, Co, or the like. The contacts may be formed on the silicide film. The contacts may be formed of a conductive material. The contacts may include, for example, W, Al, Cu, or the like, but the inventive concept is not limited thereto.

The interlayer insulating layer 130 may be formed on the source/drain regions 120. Further, the interlayer insulating layer 130 may be formed in contact with sidewalls of the gate spacers 111. The interlayer insulating layer 130 may include at least one of, for example, silicon oxide, silicon nitride, silicon oxynitride, and a low dielectric material.

The mask layer 140 may be disposed on the gate structures G1, G2, G3, and G4 and the interlayer insulating layer 130. The mask layer 140 may overlap the first fins F11 and F14 and the second fins F12 and F15 in a plan view thereof. Further, the mask layer 140 may not overlap the third fins F13 and F16.

The diffusion break region 150 may be disposed between a first gate structure G1 and a second gate structure G2. The diffusion break region 150 may be spaced apart from each of the first gate structure G1 and the second gate structure G2 in the second direction. In one exemplary embodiment, a pitch P2 between the diffusion break region 150 and the first gate structure G1 or the second gate structure G2 may be equal to a pitch P1 between the first gate structure G1 and a third gate structure G3 or the second gate structure G2 and the fourth gate structure G4, but the inventive concept is not limited thereto.

In one exemplary embodiment, the diffusion break region 150 may extend over the first region I and the second region II in the second direction like that shown in FIG. 1. Alternatively, in one exemplary embodiment, the diffusion break region 150 may be only formed in either the first region I or the second region II.

A width W2 of an upper surface of the diffusion break region 150 may be greater than a width W1 of each of the gate structures G1, G2, G3, and G4. In one exemplary embodiment, the diffusion break region 150 may have a width twice or more the width W1 of each of the gate structures G1, G2, G3, and G4, but the inventive concept is not limited thereto.

A level of the upper surface of the diffusion break region 150 may be higher than a level of an upper surface of each of the gate structures G1, G2, G3, and G4. The level of the upper surface of the diffusion break region 150 may be formed to match a level of an upper surface of the mask layer 140.

In one exemplary embodiment, the diffusion break region 150 may be formed of any one of a nitride, an oxide, and an oxynitride, or a combination thereof.

In one exemplary embodiment, the diffusion break region 150 may include a first portion 151, a second portion 152, and a third portion 153. The first portion 151 and the second portion 152 may extend in the first direction across an area between the fins F11 to F16. Further, the first portion 151 and the second portion 152 may extend into the device isolation layer STI.

The first portion 151 and the second portion 152 may be formed such that lower ends thereof have different levels LV1 and LV3 according to formed positions thereof. In one exemplary embodiment, the first portion 151 and the second portion 152 located between the fins F11 to F13 and F14 to F16 may be formed such that a level LV1 of each of the lower ends thereof is lower than a level LV2 of a lower surface of the device isolation layer STI. Further, the first portion 151 and the second portion 152 located in the device isolation layer STI may be formed such that a level LV3 of each of the lower ends thereof is higher than the level LV2 of the lower surface of the device isolation layer STI and is lower than or equal to a level LV4 of an upper surface of the device isolation layer STI. However, the inventive concept is not limited thereto, and the first portion 151 and the second portion 152 may correspond to the lower surface of the device isolation layer STI or may be located at a level higher than that of the lower surface of the device isolation layer STI, between the fins F11 to F13 and F14 to F16.

The third portion 153 may be formed between the first portion 151 and the second portion 152. The third portion 153 may be formed on the third fins F13 and F16. That is, the third portion 153 may overlap the third fins F13 and F16 in a plan view thereof. In one exemplary embodiment, a level LV6 of a lower end of the third portion 153 may be higher than a level LV5 of the upper surface of each of the fins F11 to F16 and F21 to F24.

In one exemplary embodiment, a lower surface of the third portion 153 may be formed to have a U-shape. The lower surface of the third portion 153 may be in contact with an upper surface of the interlayer insulating layer 130 disposed on the third fins F13 and F16.

The spacers 161 to 164 may be disposed on the fins F11 to F16 and F21 to F24 and the device isolation layer STI. The spacers 161 to 164 may be disposed at both sidewalls of each of the first portion 151 and the second portion 152 and may extend in the second direction. The spacers 161 to 164 may include outer spacers 161 and 162 and inner spacers 163 and 164. The inner spacers 163 and 164 may be disposed at one sidewall of the first portion 151 and one sidewall of the second portion 152 facing the one sidewall of the first portion 151, respectively. The outer spacers 161 and 162 may be disposed at the other sidewall of the first portion 151 and the other sidewall of the second portion 152, respectively. The outer spacers 161 and 162 and the inner spacers 163 and 164 may have different heights. In one exemplary embodiment, the outer spacers 161 and 162 may be formed to have a greater height than the inner spacers 163 and 164. Upper ends of the inner spacers 163 and 164 may be in contact with the third portion 153. That is, the lower surface of the third portion 153 may be in contact with the upper ends of the inner spacers 163 and 164 which are disposed at one side of the first portion 151 and a side of the second portion 152 facing the one side of the first portion 151, respectively.

Referring to FIG. 3B, a material of a lower portion of the diffusion break region 150 may be different from a material of an upper portion of the diffusion break region 150. In one exemplary embodiment, the material of the lower portion of the diffusion break region 150 may be different from the material of the upper portion of the diffusion break region 150 with respect to the upper surfaces of the fins F11 to F16 and F21 to F24. However, the inventive concept is not limited thereto, and a boundary between the material of the lower portion and the upper portion in the diffusion break region 150 may be located at a lower or higher level than the upper surfaces of the fins F11 to F16 and F21 to F24. For example, the lower portion of the diffusion break region 150 may include silicon nitride and the upper portion of the diffusion break region 150 may include an oxide. Alternatively, the lower portion of the diffusion break region 150 may include an oxide and the upper portion of the diffusion break region 150 may include silicon nitride. However, the inventive concept is not limited thereto.

Referring to FIG. 4, protrusions 151a and 152a may be formed on the first portion 151 and the second portion 152 of the diffusion break region 150, respectively. The protrusions 151a and 152a may respectively protrude from both sidewalls of the first portion 151 and both sidewalls of the second portion 152, and may be located at a lower level than the upper surfaces of the fins F11 to F16 and F21 to F24. Further, the protrusions 151a and 152a may be formed between the fins F11 to F16 and F21 to F24. A width of the protrusion 151a may be greater than widths of the outer spacer 161 and the inner spacer 163 which are disposed at both sidewalls of the first portion 151. Further, a width of the protrusion 152a may be greater than widths of the outer spacer 162 and the inner spacer 164 which are disposed at both sidewalls of the second portion 152.

Figure 5:
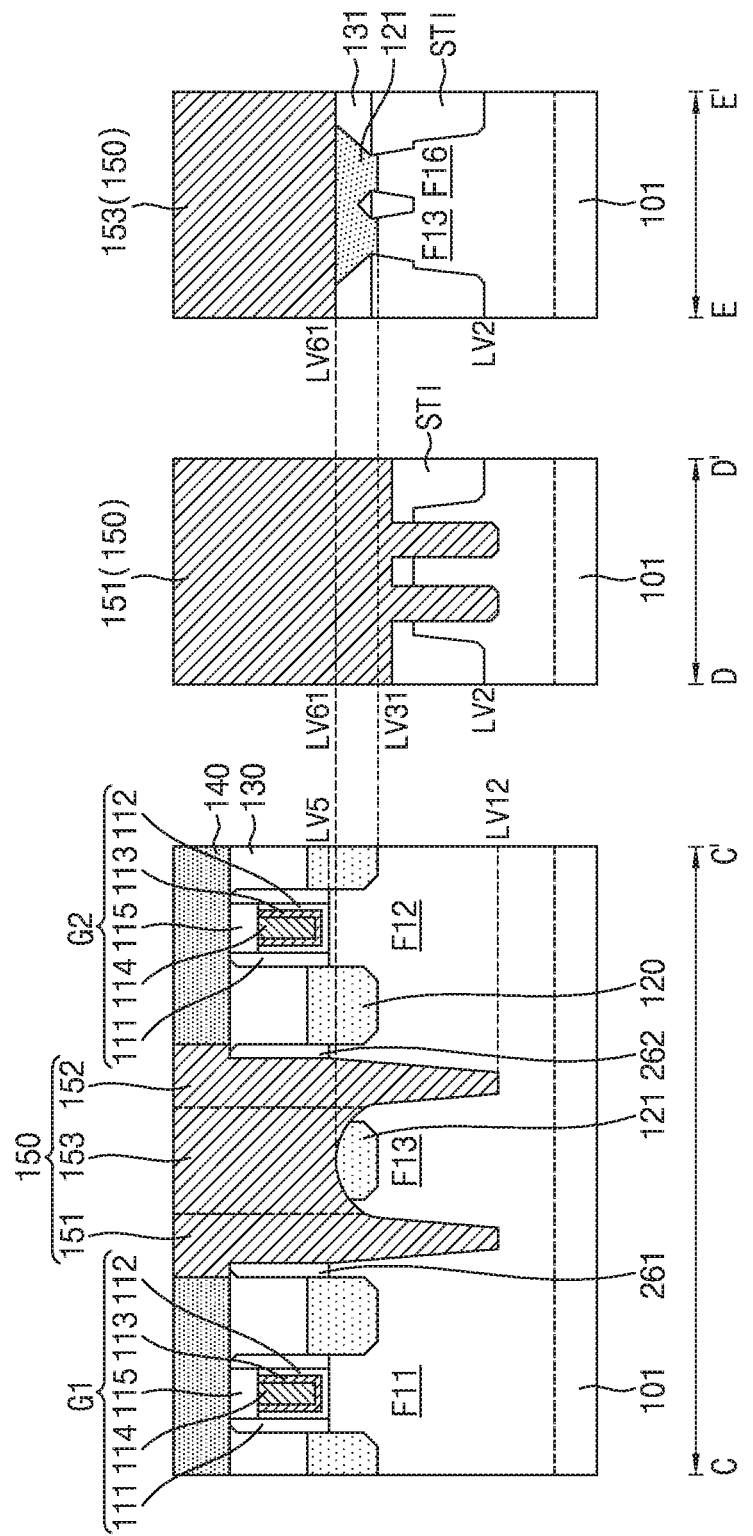
FIG. 5 shows vertical cross-sectional views of a semiconductor device according to an exemplary embodiment of the inventive concept, which are taken along lines C-C', D-D', and E-E' shown in FIG. 1.
Figure 6:
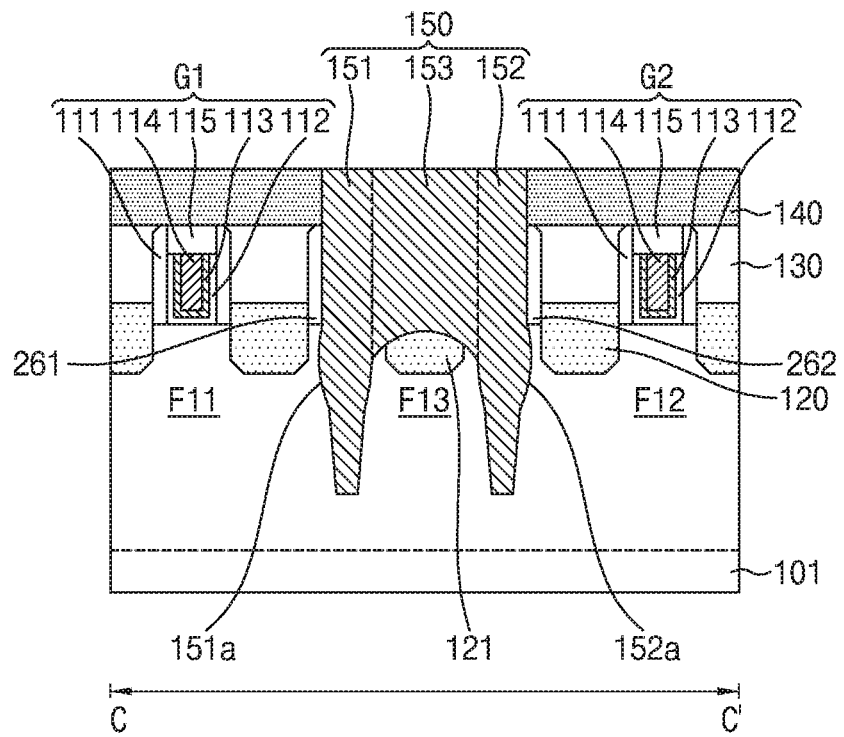
FIG. 6 is a vertical cross-sectional view of the semiconductor device according to the exemplary embodiment of the inventive concept, which taken along line C-C' shown in FIG. 1.

FIG. 5 shows vertical cross-sectional views of a semiconductor device according to an exemplary embodiment of the inventive concept, which are taken along lines C-C', D-D', and E-E' shown in FIG. 1. FIG. 6 is a vertical cross-sectional view of the semiconductor device according to the exemplary embodiment of the inventive concept, which taken along line C-C' shown in FIG. 1. Like reference numerals in FIGS. 1 to 6 denote like elements. Hereinafter, to simplify the description, substantially the same contents as those described in FIGS. 1 to 4 will be omitted.

Referring to FIG. 5, each of levels LV12, LV31, and LV61 of a lower end of a diffusion break region 150 may be lower than the levels LV1, LV3, and LV6 of the lower end of the diffusion break region 150 shown in FIG. 3A. The levels LV12 and LV31 of lower surfaces of a first portion 151 and a second portion 152 may be lower than the levels LV1 and LV3 of the lower surfaces of the first portion 151 and the second portion 152 shown in FIG. 3A, respectively. Further, the level LV61 of an upper end of a lower surface of a third portion 153 may be lower than the level LV6 of the lower end of the third portion 153 shown in FIG. 3A. However, the inventive concept is not limited thereto.

In one exemplary embodiment, the level LV61 of the upper end of the lower surface of the third portion 153 may be lower than or equal to a level LV5 of an upper surface of each of a first fin F11 and a second fin F12. The lower surface of the third portion 153 may be in contact with upper surfaces of source/drain regions 121 disposed on third fins F13 and F16. Further, the lower surface of the third portion 153 may be in contact with upper ends of the third fins F13 and F16.

The source/drain regions 121 may be disposed between the third fins F13 and F16 and the third portion 153. Heights of the source/drain regions 121 may be smaller than heights of source/drain regions 120 formed on the first fins F11 and F14 and the second fins F12 and F15.

Spacers 261 and 262 may be formed at one sidewall of the first portion 151 facing the first gate structure G1 and one sidewall of the second portion 152 facing the second gate structure G2, respectively. That is, the spacers 261 and 262 may correspond to the outer spacers 161 and 162 of FIG. 3A. That is, the spacers 261 and 262 may not include components corresponding to the inner spacers 163 and 164 of FIG. 3A.

Referring to FIG. 6, the diffusion break region 150 may further include protrusions 151a and 152a. The protrusions 151a and 152a of the diffusion break region 150 may be formed similarly to the protrusions 151a and 152a of FIG. 4. That is, the protrusions 151a and 152a may respectively protrude from both sidewalls of the first portion 151 and both sidewalls of the second portion 152. Further, the protrusions 151a and 152a may be located at a lower level than the upper surfaces of the fins F11 and F12.

Figure 7:
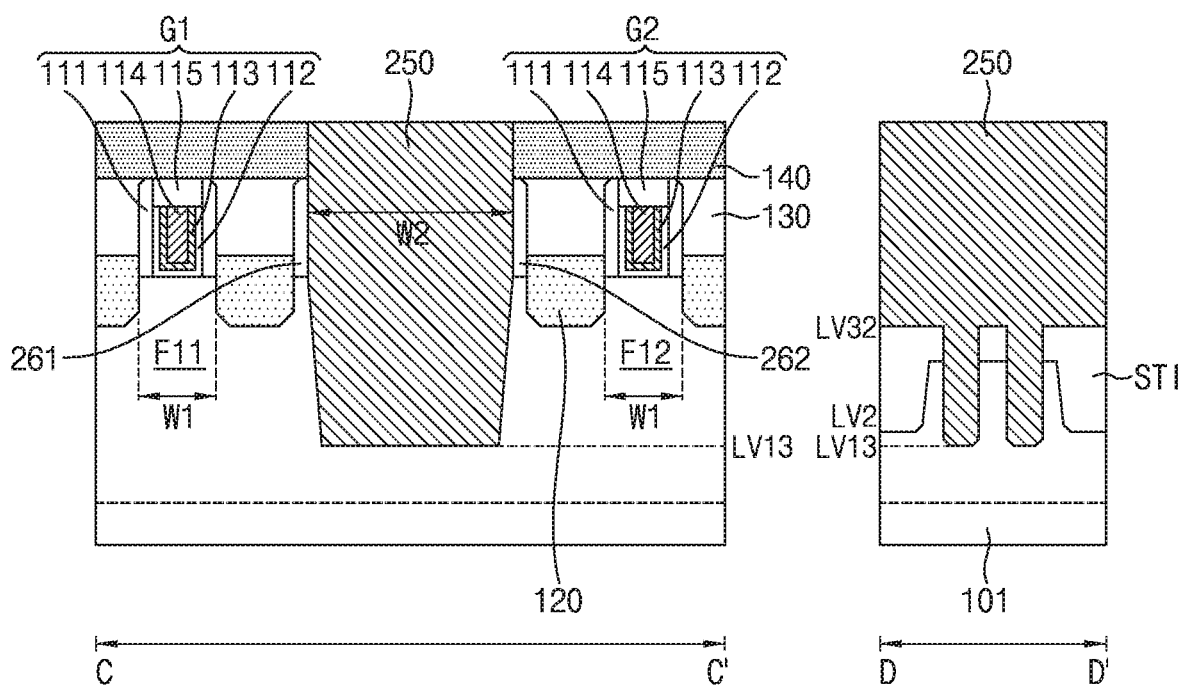
FIG. 7 shows vertical cross-sectional views of a semiconductor device according to an exemplary embodiment of the inventive concept, which are taken along lines C-C' and D-D' shown in FIG. 1.
Figure 8:
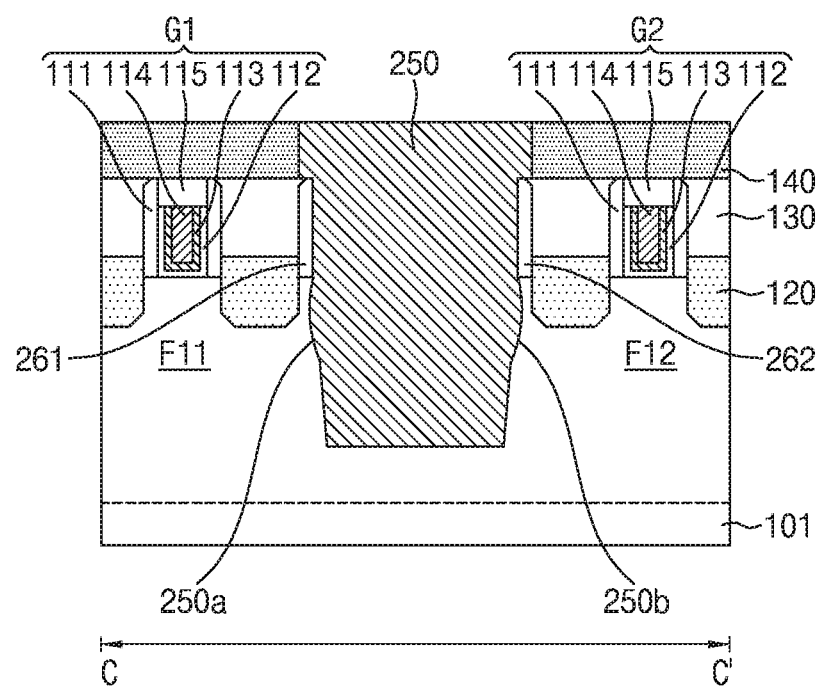
FIG. 8 is a vertical cross-sectional view of the semiconductor device according to the exemplary embodiment of the inventive concept, which is taken along line C-C' shown in FIG. 1.
Figure 9:
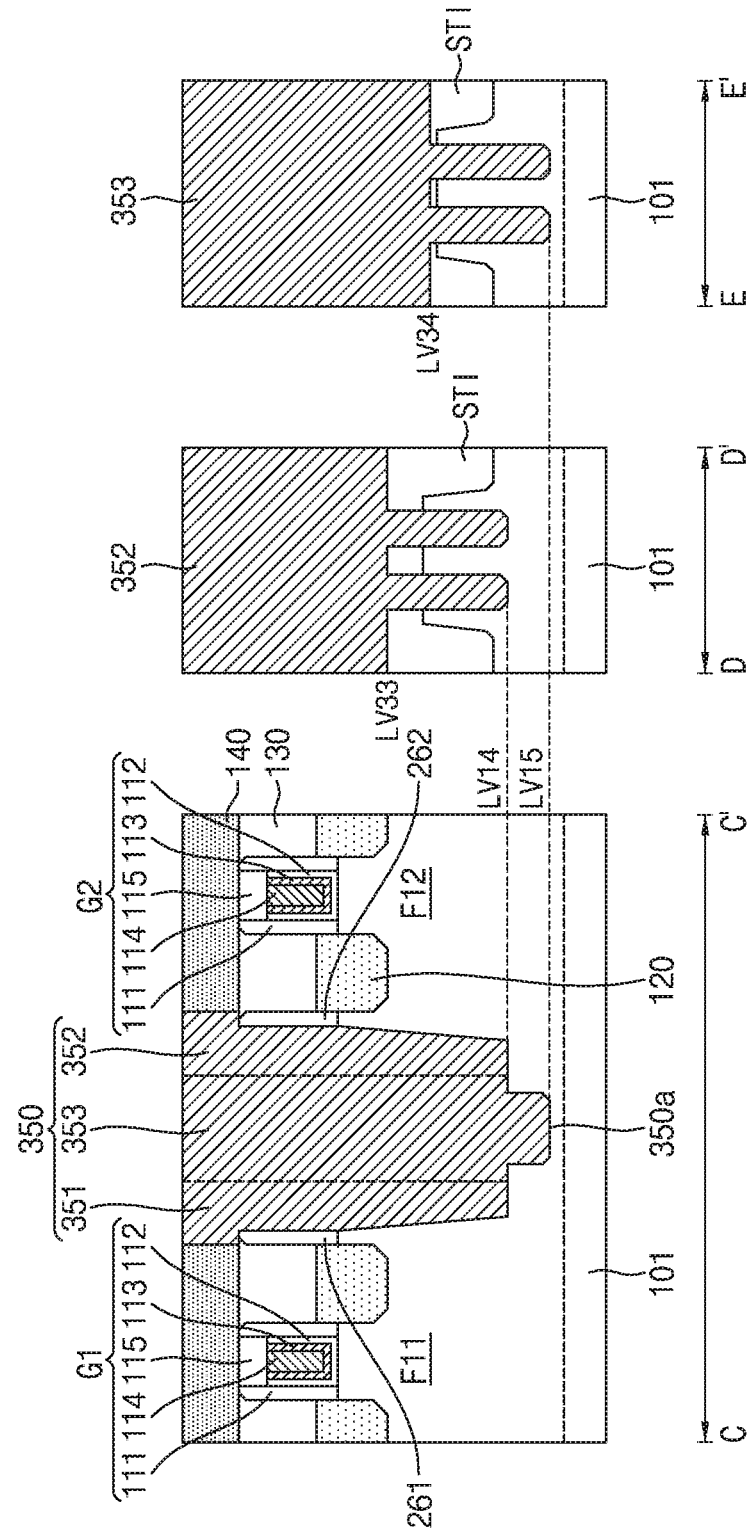
FIG. 9 shows vertical cross-sectional views of a semiconductor device according to an exemplary embodiment of the inventive concept, which are taken along lines C-C', D-D', and E-E' shown in FIG. 1.
Figure 10:
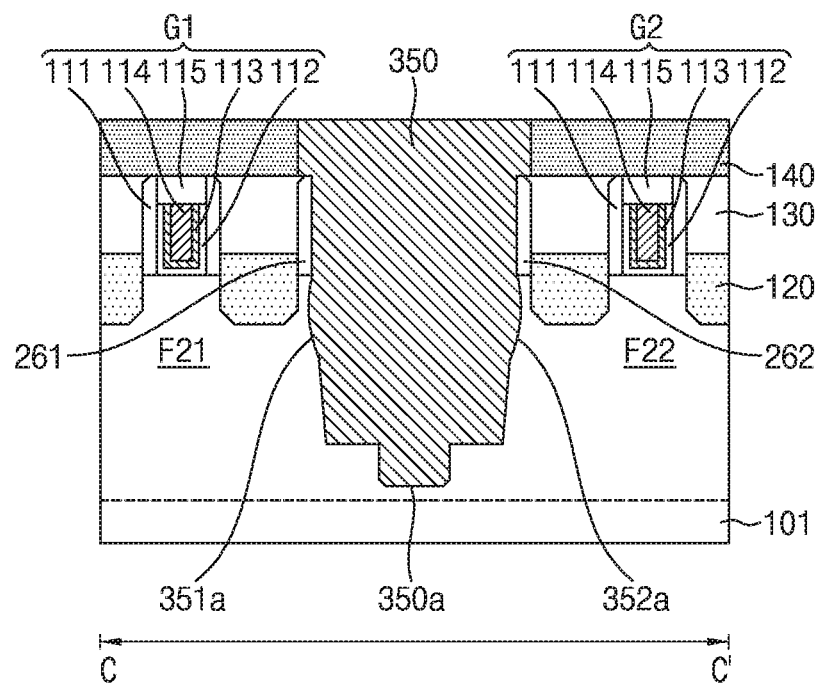
FIG. 10 is a vertical cross-sectional view of the semiconductor device according to the exemplary embodiment of the inventive concept, which is taken along line C-C' shown in FIG. 1.

FIG. 7 shows vertical cross-sectional views of a semiconductor device according to an exemplary embodiment of the inventive concept, which are taken along lines C-C' and D-D' shown in FIG. 1. FIG. 8 is a vertical cross-sectional view of the semiconductor device according to the exemplary embodiment of the inventive concept, which is taken along line C-C' shown in FIG. 1. FIG. 9 shows vertical cross-sectional views of a semiconductor device according to an exemplary embodiment of the inventive concept, which are taken along lines C-C', D-D', and E-E' shown in FIG. 1. FIG. 10 is a vertical cross-sectional view of the semiconductor device according to the exemplary embodiment of the inventive concept, which is taken along line C-C' shown in FIG. 1. Like reference numerals in FIGS. 1 to 10 denote like elements. Hereinafter, to simplify the description, substantially the same contents as those described in FIGS. 1 to 6 will be omitted.

Referring to FIG. 7, the semiconductor device according to the exemplary embodiment of the inventive concept may include a first fin F11, a second fin F12, a diffusion break region 250, and spacers 261 and 262.

The diffusion break region 250 may be disposed between the first fin F11 and the second fin F12. In one exemplary embodiment, a width W2 of the diffusion break region 250 may be twice or more a width W1 of a gate structure. A lower surface of the diffusion break region 250 may also have a width twice or more the width W1 of the gate structure.

The diffusion break region 250 may be formed to have a lower end at a different level according to a formed position thereof. A level LV13 of a lower end of the diffusion break region 250 located between the first fin F11 and the second fin F12 may be lower than a level LV2 of a lower surface of a device isolation layer STI. Further, a level LV32 of a lower surface of the diffusion break region 250 located in the device isolation layer STI may be lower than a level LV4 (see FIGS. 1 and 3A) of an upper surface of the device isolation layer STI.

Although not shown in the drawing, a material of a lower portion of the diffusion break region 250 may be different from a material of an upper portion of the diffusion break region 250 like in the diffusion break region 150 of FIG. 3B.

Referring to FIG. 8, protrusions 250a and 250b may be formed on both sidewalls of a diffusion break region 250. The protrusions 250a and 250b of FIG. 8 may be formed similarly to the protrusions of FIGS. 4 and 6. That is, the protrusions 250a and 250b may protrude from the both sidewalls of the diffusion break region 250. Further, the protrusions 250a and 250b may be located at a lower level than each of upper surfaces of the fins F11 and F12.

Referring to FIG. 9, a diffusion break region 350 may be divided into a first portion 351, a second portion 352, and a third portion 353. The first portion 351 may be formed in contact with a first fin. The second portion 352 may be formed in contact with a second fin. The third portion 353 may be interposed between the first portion 351 and the second portion 352. That is, the third portion 353 may extend in a direction in which the first portion 351 and the second portion 352 face each other.

The diffusion break region 350 may further include a downward protrusion 350a. The downward protrusion 350a may be formed by the third portion 353 extending downward. As a result, levels LV15 and LV34 of a lower end of the third portion 353 may be lower than levels LV14 and LV33 of the first portion 351 and the second portion 352. That is, the level LV14 of a lower end of each of the first portion 351 and the second portion 352 located between the first fin F11 and the second fin F12 may be higher than the level LV15 of the lower end of the third portion 353 located between the first fin F11 and the second fin F12. Further, the level LV33 of the lower end of each of the first portion 351 and the second portion 352 located in the device isolation layer STI may be higher than the level LV34 of the lower end of each of the first portion 351 and the second portion 352 located in the device isolation layer STI.

In one exemplary embodiment, a difference between the level LV14 of the lower end of each of the first portion 351 and the second portion 352 located between the first fin F11 and the second fin F12 and the level LV15 of the lower end of the third portion 353 may be greater than a difference between the level LV33 of the lower end of each of the first portion 351 and the second portion 352 located in the device isolation layer STI and the level LV34 of the lower end of the third portion 353. However, the inventive concept is not limited thereto.

Referring to FIG. 10, the diffusion break region 350 may further include protrusions 351a and 352a. The protrusions 351a and 352a may be formed to be identical to the protrusions 250a and 250b of FIG. 8.

FIGS. 11 to 15 are vertical cross-sectional views taken along line G-G' of FIG. 1 according to exemplary embodiments of the inventive concept. FIG. 16 is a vertical cross-sectional view taken along line H-H' of FIG. 1 according to the exemplary embodiment of the inventive concept. Like reference numerals in FIGS. 1 to 16 denote like elements. Hereinafter, to simplify the description, substantially the same contents as those described in FIGS. 1 to 10 will be omitted.

Figure 11:
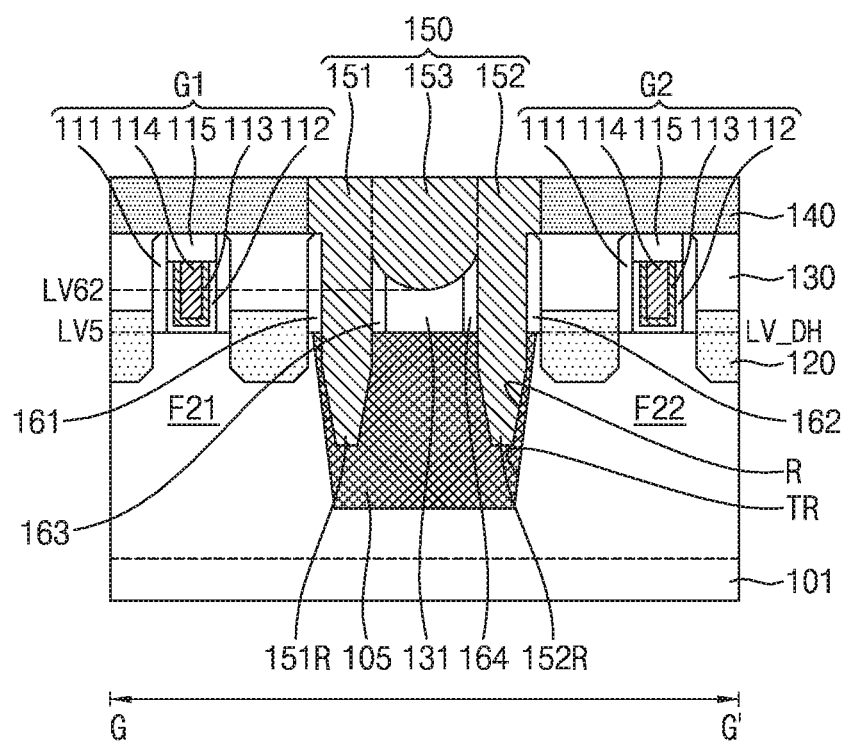
FIGS. 11 to 15 are vertical cross-sectional views taken along line G-G' of FIG. 1 according to alternative exemplary embodiments of the inventive concept.

Referring to FIGS. 1 and 11, the semiconductor device according to the exemplary embodiment of the inventive concept may include a first diffusion break region 105, a second diffusion break region 150, and spacers 161 to 164.

As shown in FIG. 1, the first diffusion break region 105 may be disposed in a second region II, but the inventive concept is not limited thereto. The first diffusion break region 105 may be disposed between first fins F21 and F22 and second fins F23 and F24. The first diffusion break region 105 may extend in a second direction along short sides of the fins F21 to F24.

A level of a lower surface of the first diffusion break region 105 may be lower than a level of an upper surface of a substrate 101. A level LV_DH of an upper surface of the first diffusion break region 105 may be lower than or equal to a level LV5 of an upper surface of each of the fins F21 to F24, but the inventive concept is not limited thereto. The level of the upper surface of the first diffusion break region 105 may be higher than the level LV5 of the upper surface of each of the fins F21 to F24.

Recesses R may be formed in the first diffusion break region 105. The recesses R may extend in the second direction in the first diffusion break region 105. For example, a depth of the recess R may be about half of a depth of the first diffusion break region 105, but the inventive concept is not limited thereto. For example, the first diffusion break region 105 may be formed of an oxide, a nitride, an oxynitride, or a combination thereof.

The second diffusion break region 150 may be disposed on the first diffusion break region 105. The second diffusion break region 150 may overlap the first diffusion break region 105 in a plan view thereof.

The second diffusion break region 150 may include a first portion 151, a second portion 152, and a third portion 153. The first portion 151 and the second portion 152 may extend into the first diffusion break region 105. That is, lower portions of the first portion 151 and the second portion 152 may be formed in the recesses R of the first diffusion break region 105.

The third portion 153 may be formed between the first portion 151 and the second portion 152. The third portion 153 may extend in a direction in which upper portions of the first portion 151 and the second portion 152 face each other.

In one exemplary embodiment, a level LV62 of a lower end of the third portion 153 may be higher than the level LV5 of the upper surface of each of the fins F21 to F24. For example, a lower surface of the third portion 153 may be formed to have a U-shape. The lower surface of the third portion 153 may be in contact with an upper surface of an interlayer insulating layer 131 disposed on the first diffusion break region 105.

The spacers 161 to 164 may be disposed on the fins F21 to F24 and the first diffusion break region 105. The spacers 161 to 164 may be disposed at both sidewalls of each of the first portion 151 and the second portion 152 and may extend in a second direction. The spacers 161 to 164 may include outer spacers 161 and 162 and inner spacers 163 and 164. The inner spacers 163 and 164 may be disposed at one sidewall of the first portion 151 and one sidewall of the second portion 152 facing the one sidewall of the first portion 151, respectively. The outer spacers 161 and 162 may be disposed at the other sidewall of the first portion 151 and the other sidewall of the second portion 152, respectively. The outer spacers 161 and 162 and the inner spacers 163 and 164 may have different heights. In one exemplary embodiment, the outer spacers 161 and 162 may be formed to have a greater height than the inner spacers 163 and 164. Upper ends of the inner spacers 163 and 164 may be in contact with the third portion 153.

Figure 12:
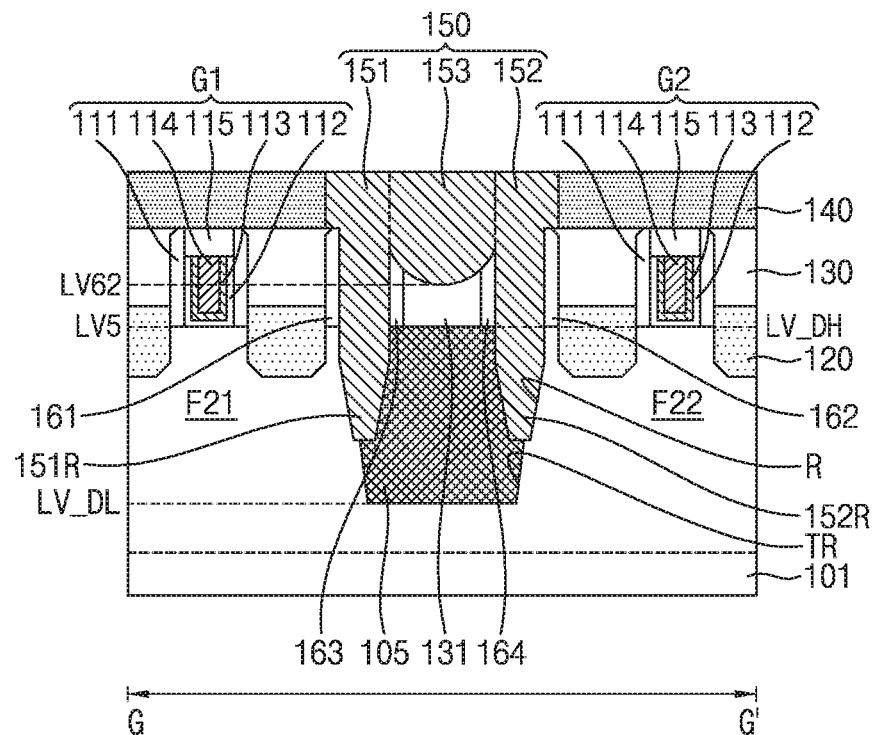

Referring to FIG. 12, a semiconductor device according to an exemplary embodiment of the inventive concept may include recesses R formed between fins F21 to F24 and a first diffusion break region 105. Portions of the recesses R may be formed at sidewalls of a first diffusion break region 105 extending in a second direction. Further, other portions of the recesses R may be formed at short sides of the fins F21 to F24.

In one exemplary embodiment, a second diffusion break region 150 may be interposed between the first diffusion break region 105 and the fins F21 to F24. That is, the second diffusion break region 150 may be formed in the recesses R. As a result, a lower portion of the first portion 151 of the second diffusion break region 150 may be in contact with a cross section of a first fin F21 and may be in contact with one sidewall of the first diffusion break region 105. Further, the second portion 152 of the second diffusion break region 150 may be in contact with a cross section of a second fin F22 and may be in contact with another sidewall of the first diffusion break region 105.

Figure 13:
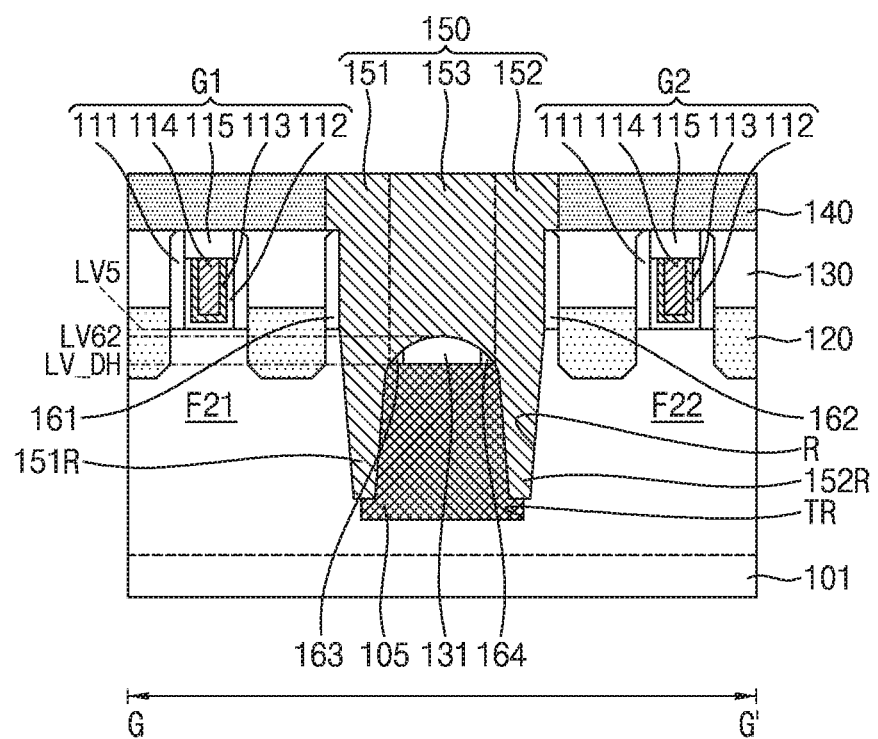

Referring to FIG. 13, in one exemplary embodiment, a level LV62 of a lower surface of a third portion 153 may be lower than a level LV5 of an upper surface of each of fins F21 and F22. Further, the level LV62 of the lower surface of the third portion 153 may be higher than a level LV_DH of an upper surface of a first diffusion break region 105. A lower end of the lower surface of the third portion 153 may be in contact with the upper surface of the first diffusion break region 105, but the inventive concept is not limited thereto. In one exemplary embodiment, the lower surface of the third portion 153 may be formed to have an inverted U-shape.

Inner spacers 163 and 164 and an interlayer insulating layer 131 may be interposed between the first diffusion break region 105 and the third portion 153. Alternatively, only the interlayer insulating layer 131 may be interposed between the first diffusion break region 105 and the third portion 153 without the inner spacers 163 and 164. Alternatively, the upper surface of the first diffusion break region 105 and an upper surface of the third portion 153 of the second diffusion break region 150 are in contact with each other, and thus the inner spacers 163 and 164 and the interlayer insulating layer 131 may be omitted.

Figure 14:
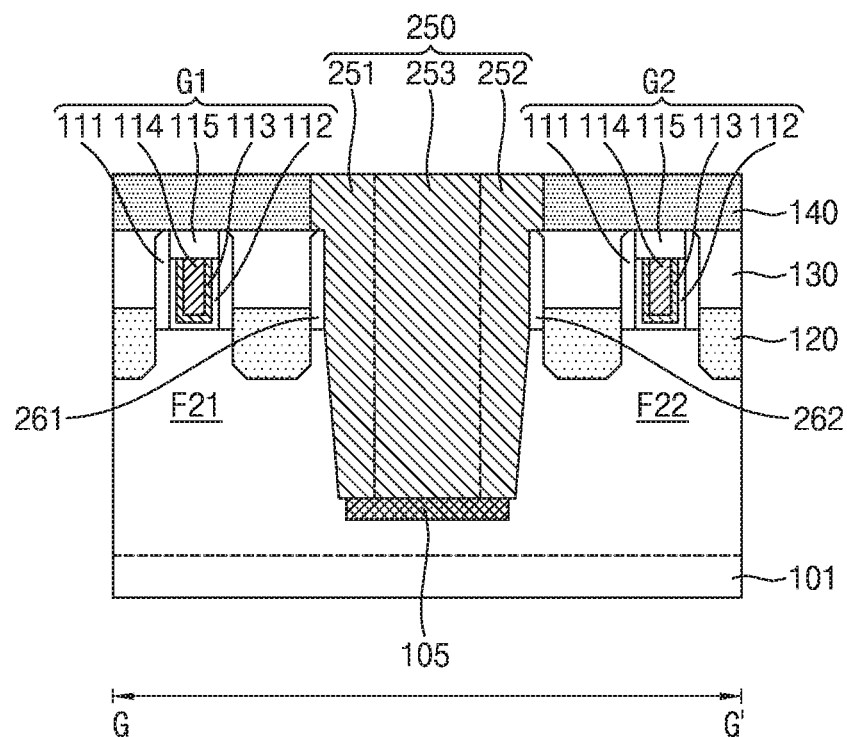

Referring to FIG. 14, a lower surface of a second diffusion break region 250 may be formed in contact with an upper surface of a first diffusion break region 105. The second diffusion break region 250 may be identical to the second diffusion break region of FIG. 7. That is, a level of a lower surface of a third portion 253 may be formed to match levels of lower surfaces of a first portion 251 and a second portion 252.

Figure 15:
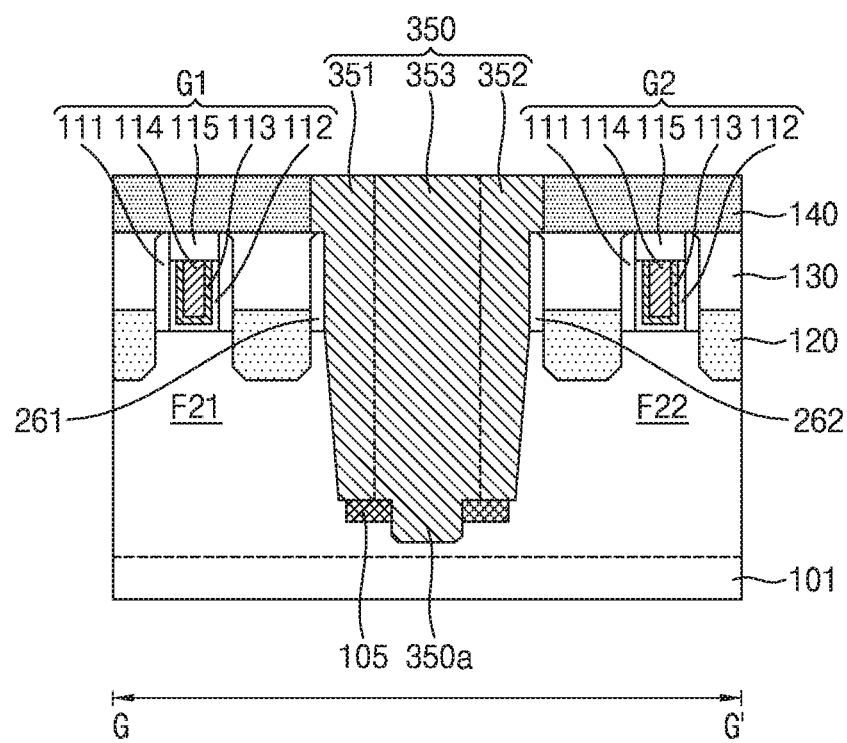
Figure 16:
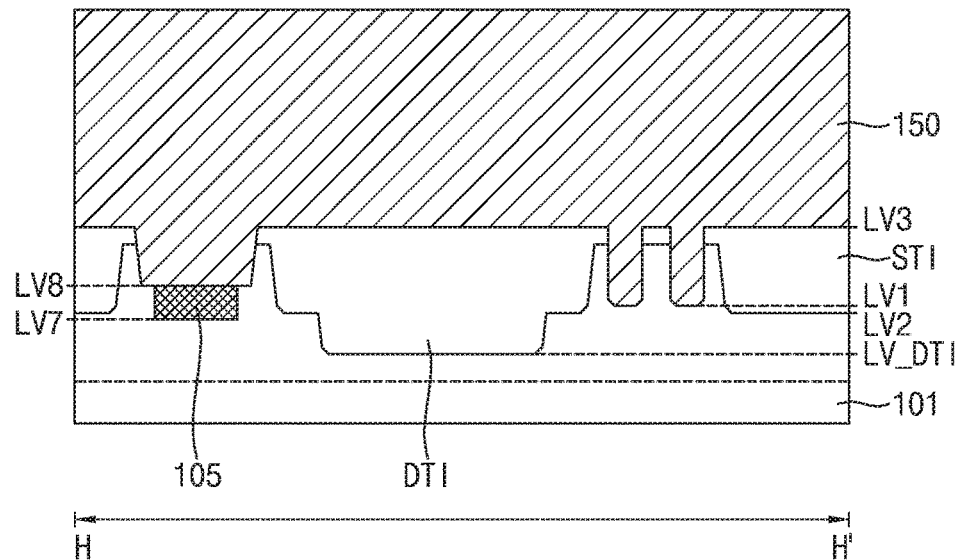
FIG. 16 is a vertical cross-sectional view taken along line H-H' of FIG. 1 according to the exemplary embodiment of the inventive concept.

Referring to FIG. 15, a downward protrusion 350a may be formed by a third portion 353 of a second diffusion break region 350 extending downward. As a result, a level of a lower surface of the third portion 353 may be lower than levels of lower surfaces of a first portion 351 and a second portion 352. In one exemplary embodiment, the third portion 353 may extend downward to pass through a first diffusion break region 105 located at a lower portion of a second diffusion break region 150. The level of the lower surface of the third portion 353 may be lower than a level of a lower surface of the first diffusion break region 105 and the lower surface of the third portion 353 may be in contact with a substrate 101. In one exemplary embodiment, the third portion 353 may be disposed in the first diffusion break region 105. That is, the level of the lower surface of the third portion 353 may be lower than a level of an upper surface of the first diffusion break region 105 and may be higher than the level of the lower surface of the first diffusion break region 105.

In FIGS. 14 and 15, a height of the first diffusion break region 105 is shown as being relatively smaller than heights of the second diffusion break region 250 and 350, but the inventive concept is not limited thereto. The level of the upper surface of the first diffusion break region 105 may be variously changed to be lower than levels of upper surfaces of fins F21 to F24.

Referring to FIG. 16, a deep device isolation layer DTI may be disposed between a first region I and a second region II. A lower surface of the deep device isolation layer DTI may be located at a level LV_DTI lower than a level LV2 of a lower surface of a device isolation layer STI. In one exemplary embodiment, a lower surface of a first diffusion break region 105 may correspond to the lower surface of the device isolation layer STI or may be located at a level LV7 lower than that of the lower surface of the device isolation layer STI, but the inventive concept is not limited thereto, and the lower surface of the first diffusion break region 105 may be located at a level higher than that of the lower surface of the device isolation layer STI. A lower surface of a second diffusion break region 150 may be located at a level higher than that of the lower surface of the device isolation layer STI in the first region I. However, as described above, the lower surface of the second diffusion break region 150 may correspond to the lower surface of the device isolation layer STI or may be located at a level lower than that of the lower surface of the device isolation layer STI. Further, the lower surface of the second diffusion break region 150 may have different levels LV1 and LV8 in the first region I and the second region II, respectively, but the inventive concept is not limited thereto, and the lower surface of the second diffusion break region 150 may have a level matching each other.

FIGS. 17A to 20 are views for describing a method of manufacturing a semiconductor device having the first region shown in FIG. 1 according to an exemplary embodiment of the inventive concept. Like reference numerals in FIGS. 1 to 20 denote like elements. Hereinafter, to simplify the description, substantially the same contents as those described in FIGS. 1 to 15 will be omitted.

Figure 17A:
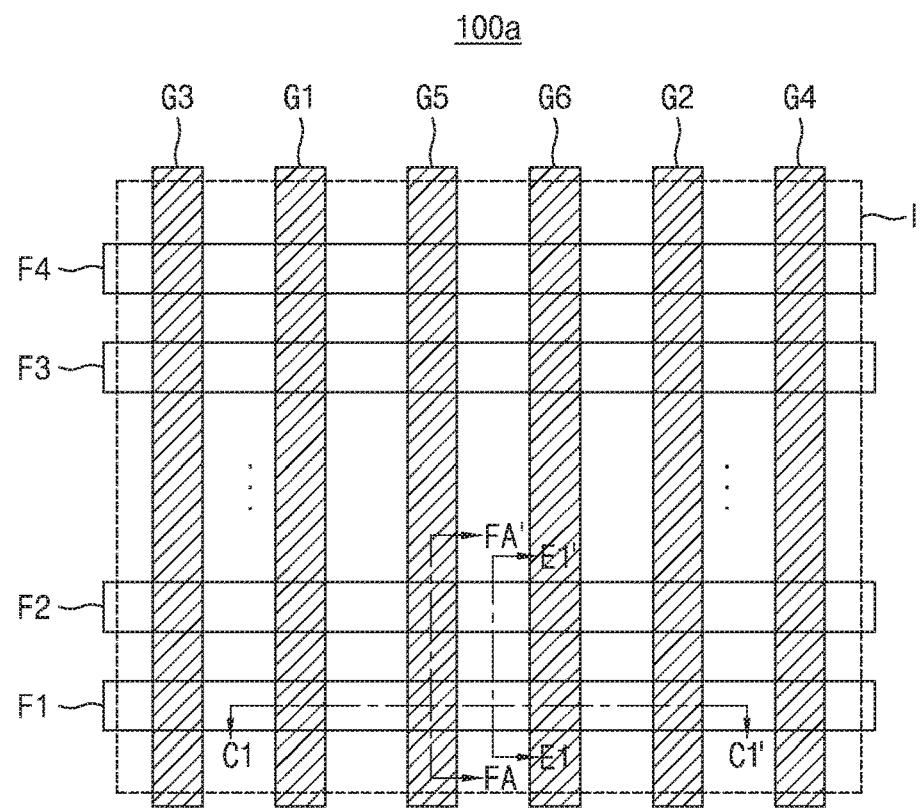
FIG. 17A is a plan view of a semiconductor device according to an embodiment of the inventive concept.
Figure 17B:
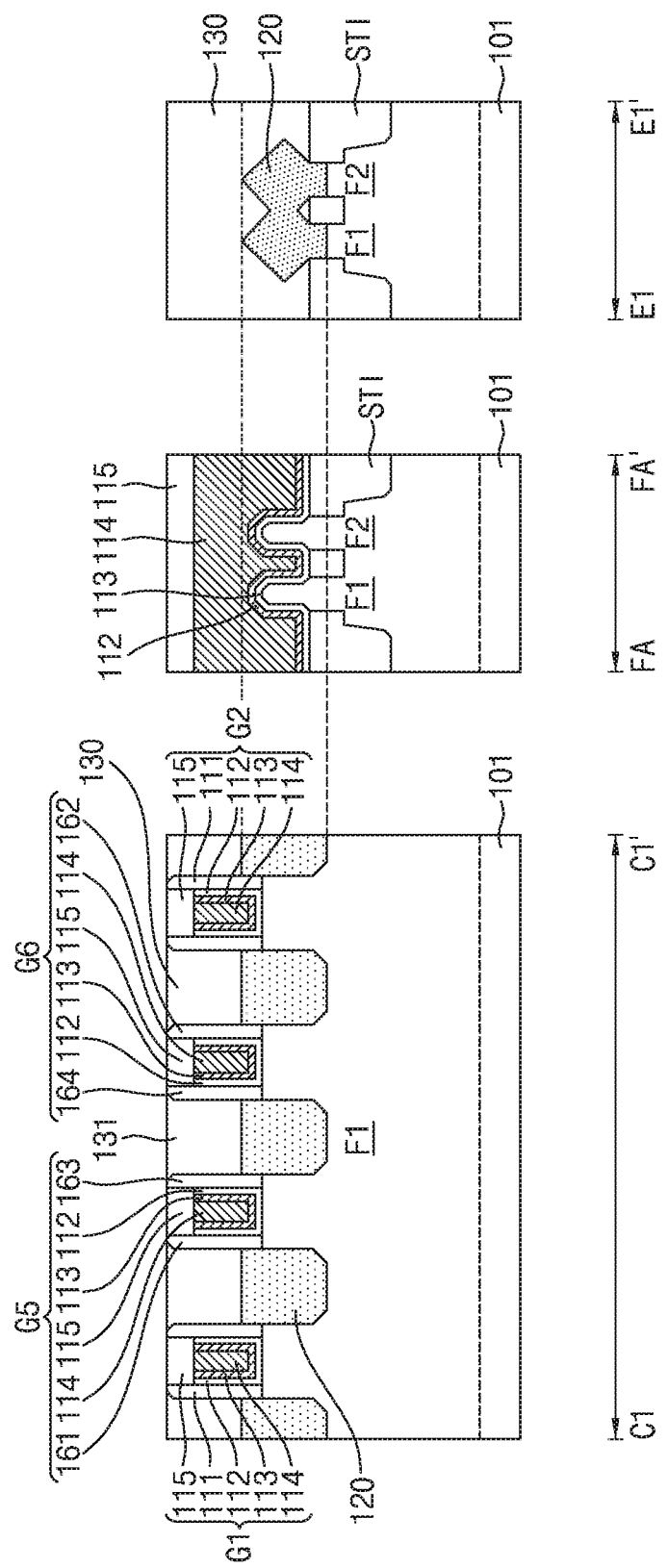
FIG. 17B is a cross-sectional view of the device of FIG. 17A at an intermediate stage of fabrication, taken along lines C1-C1', FA-FA' and E1-E1'.

FIGS. 17A and 17B show a semiconductor device 100a in which a process of forming preliminary fins F1 to F4 on a substrate 101 and a gate replacement process are completed. Referring to FIGS. 17A and 17B, in the semiconductor device 100a in which the gate replacement process is completed, preliminary fins F1 to F4, gate structures G1 to G4, sacrificial gate structures G5 and G6, source/drain regions 120, a device isolation layer STI, and an interlayer insulating layer 130 may be formed on the substrate 101.

Figure 18A:
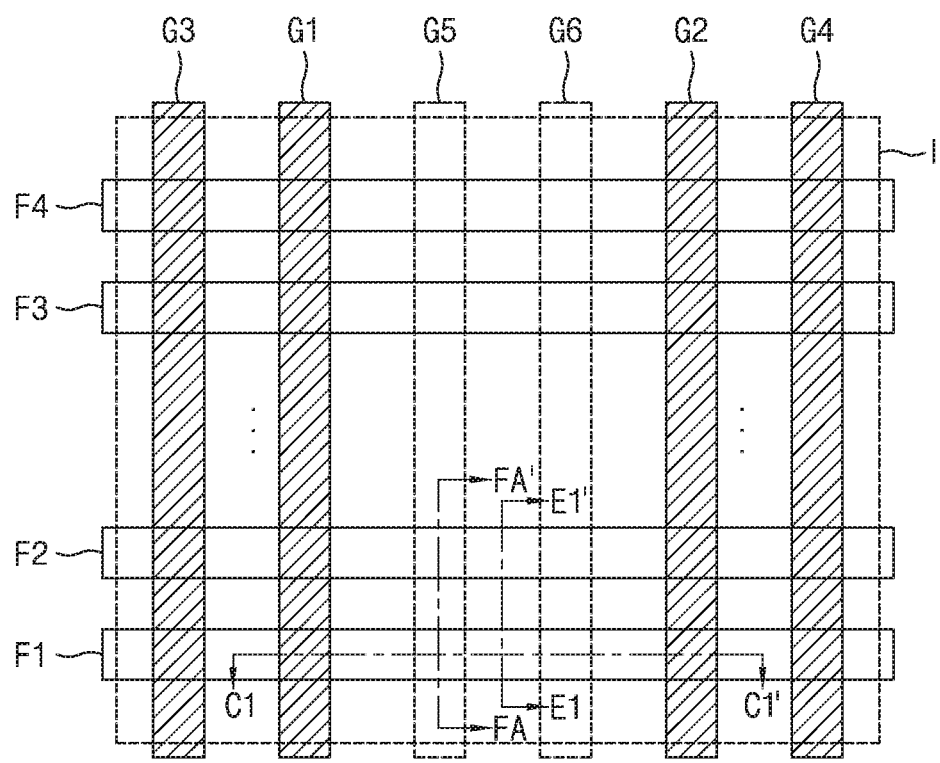
FIG. 18A is a plan view of a semiconductor device according to an embodiment of the inventive concept.
Figure 18B:
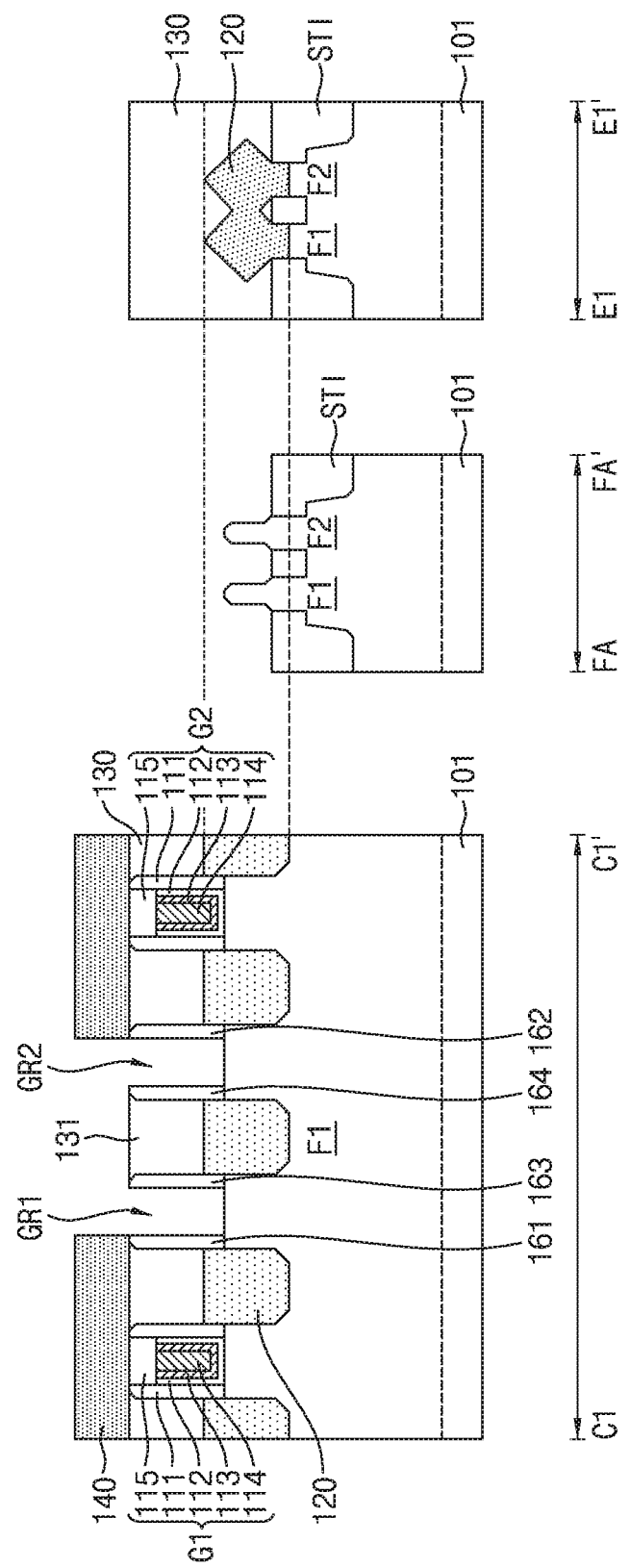
FIG. 18B is a cross-sectional view of the device of FIG. 18A at an intermediate stage of fabrication, taken along lines C1-C1', FA-FA' and E1-E1'.

Referring to FIGS. 18A and 18B, after the gate replacement process is completed, a mask layer 140 may be formed on the gate structures G1 to G4, the sacrificial gate structures G5 and G6, and the interlayer insulating layer 130. Although not shown in the drawing, a photoresist film may be formed on the mask layer 140. The photoresist film may be formed to be aligned with sidewalls of spacers in the sacrificial gate structures G5 and G6 or gate electrodes 113 and 114 of the sacrificial gate structures G5 and G6. For example, the photoresist film may be formed to be aligned with one sidewall of the spacer 161 in the sacrificial gate structure G5 facing the gate insulating layer 112 and one sidewall of the spacer 162 in the sacrificial gate structure G6 facing the gate insulating layer 112, but the inventive concept is not limited thereto, and the photoresist film may be formed to be misaligned therewith. An open region OP may be formed by etching a portion of the mask layer 140 using the photoresist film as an etch mask. Upper surfaces of the fifth gate structure G5 and the sixth gate structure G6 may be exposed through the open region OP of the mask layer 140. Further, an upper surface of an interlayer insulating layer 131 located between the fifth gate structure G5 and the sixth gate structure G6 may be exposed through the open region OP of the mask layer 140. After the open region OP is formed, the photoresist film may be removed.

A gate capping layer 115, the gate electrodes 113 and 114, and a gate insulating layer 112 of the fifth gate structure G5 and the sixth gate structure G6 may be sequentially etched and removed through the open region OP. By removing the gate capping layer 115, the gate electrodes 113 and 114, and the gate insulating layer 112, gate recesses GR1 and GR2 may be formed between the spacers 161 and 163 and between the spacers 162 and 164, respectively. Upper portions of the preliminary fins F1 to F4 may be exposed through the gate recesses GR1 and GR2. Further, an upper surface of the device isolation layer STI may also be exposed. For example, the gate capping layer 115, the gate electrodes 113 and 114, and the gate insulating layer 112 may be removed by isotropic etching. In the isotropic etching, an etch material having a high etch selectivity ratio with respect to each of the gate capping layer 115, the gate electrodes 113 and 114, and the gate insulating layer 112 may be used.

Figure 19A:
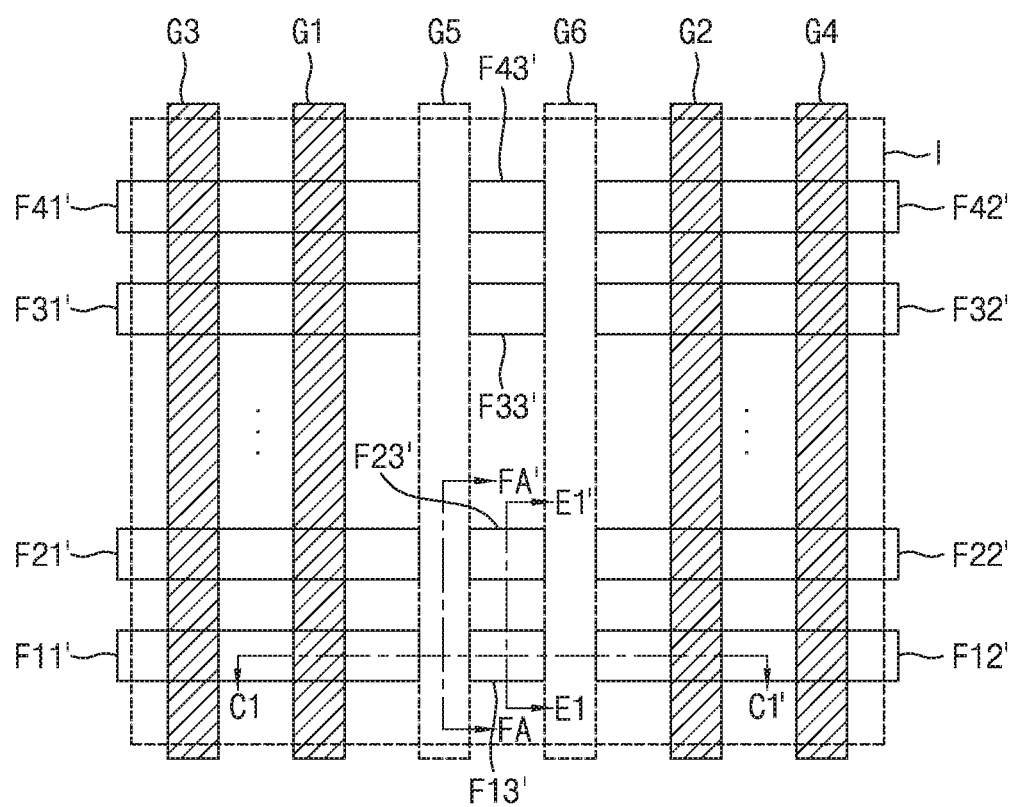
FIG. 19A is a plan view of a semiconductor device according to an embodiment of the inventive concept.
Figure 19B:
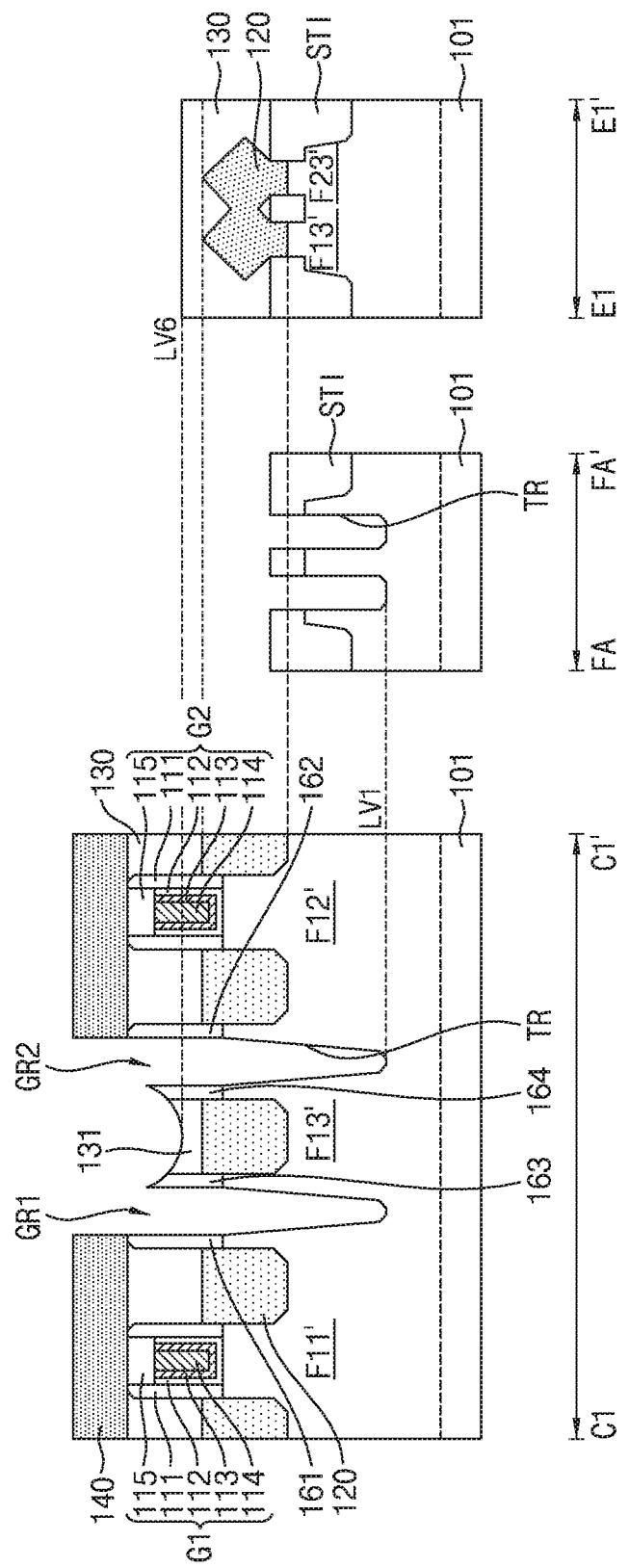
FIG. 19B is a cross-sectional view of the device of FIG. 19A at an intermediate stage of fabrication, taken along lines C1-C1', FA-FA' and E1-E1'.

Referring to FIGS. 19A and 19B, the preliminary fins F1 to F4 may be partially etched through the gate recesses GR1 and GR2 so that first fins F11', F21', F31', and F41', second fins F12', F22', F32', and F42', and third fins F13', F23', F33', and F43' may be formed. That is, trenches TR may be formed to extend into the preliminary fins F1 to F4 and define first to third fins. The trenches TR may extend in a second direction across the preliminary fins F1 to F4 extending in a first direction.

In the process of etching the preliminary fins F1 to F4, an etch material having a high etch selectivity ratio with respect to the preliminary fins F1 to F4 may be used. In one exemplary embodiment, the preliminary fins F1 to F4 may be etched by anisotropic etching. The device isolation layer STI may also be etched together with the preliminary fins F1 to F4 by the anisotropic etching. As a result, the trenches TR may be formed across the device isolation layer STI extending in the first direction.

Further, the gate spacers 163 and 164 and the interlayer insulating layer 131 located on the third fin F13', F23', F33', and F43' may be etched by the anisotropic etching. As a result, an upper surface of the interlayer insulating layer 131 may be formed to have a U-shape. Further, heights of the spacers 163 and 164 located on the third fins F13', F23', F33', and F43' may be lower than heights of the gate spacers 111 located on the first fins F11', F21', F31', and F41' and the second fins F12', F22', F32', and F42'. A height of the interlayer insulating layer 131 on the third fins F13', F23', F33', and F43' may be lower than a height of the interlayer insulating layer 130 located on the first fins F11', F21', F31', and F41' and the second fins F12', F22', F32', and F42'.

Next, the trenches TR, the gate recesses GR1 and GR2 may be buried so that the diffusion break region 150 like that shown in FIG. 3A may be formed.

Although not shown in the drawing, in one exemplary embodiment, the preliminary fins F1 to F4 may be partially removed by isotropic etching, and then the remaining portions of the preliminary fins F1 to F4 may be etched by anisotropic etching. Widths of upper portions of the trenches TR may be greater than widths of the gate recesses GR1 and GR2 by the isotropic etching which is performed before the anisotropic etching. When the gate recesses GR1 and GR2 are filled with the diffusion break region, protrusions 151a and 152a having widths greater than the widths of the gate recesses GR1 and GR2 may be formed in the diffusion break region like those shown in FIG. 4.

Figure 20:
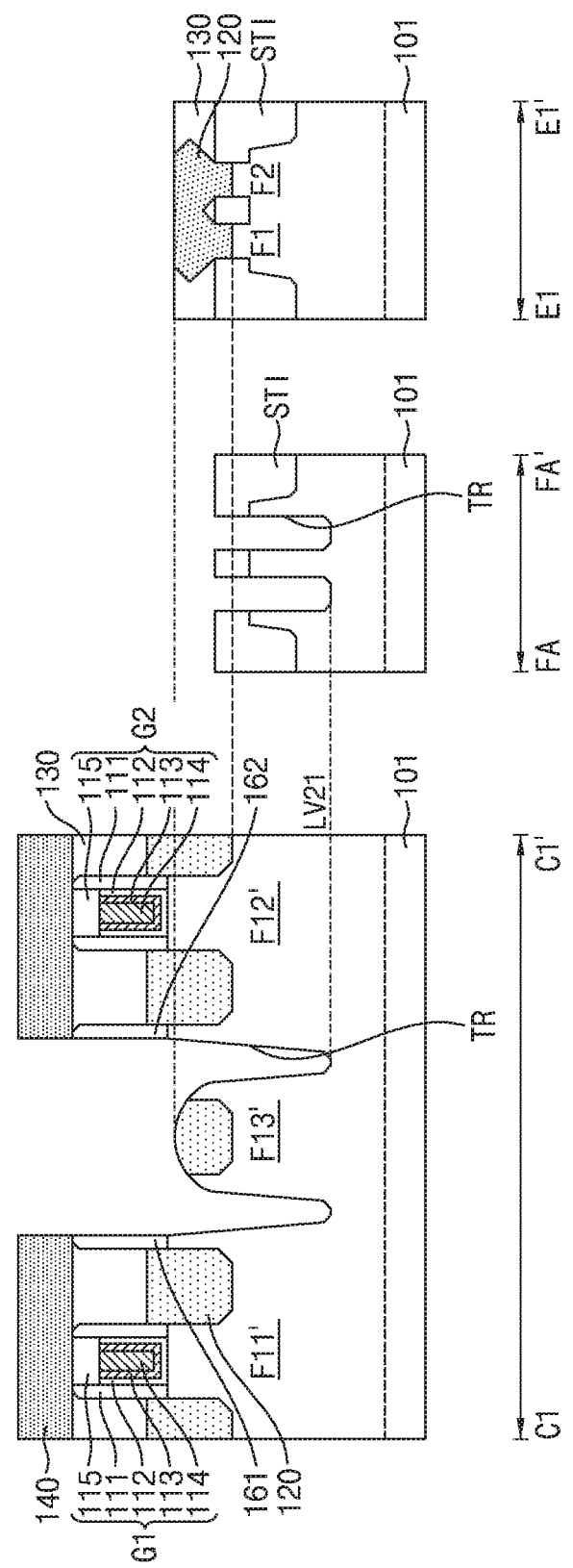
FIG. 20 is a cross-sectional view of the device of FIG. 19A at an intermediate stage of fabrication, taken along lines C1-C1', FA-FA' and E1-E1'.

Referring to FIG. 20, the gate spacers 111 and the interlayer insulating layer 130 which are formed on the third fins F13', F23', F33', and F43' and shown in FIG. 19B may be removed by additionally performing anisotropic etching. Further, depths of the trenches TR may be increased by the additional performance of the anisotropic etching. The additional performance of the anisotropic etching may be performed until levels of upper surfaces of the third fins F13', F23', F33', and F43' becomes lower than levels of upper surfaces of the first fins F11', F21', F31', and F41' and the second fins F12', F22', F32', and F42'. As a result, portions of source/drain regions 120 may be etched and upper surfaces of the source/drain regions 120 may be exposed. For example, the exposed upper surfaces of the source/drain regions 120 may be formed to have an inverted U-shape.

Next, the trenches TR and the gate recesses GR1 and GR2 may be buried so that the diffusion break region 150 like that shown in FIG. 5 may be formed.

FIGS. 21 to 27 are views for describing a method of manufacturing a semiconductor device having the second region shown in FIG. 1 according to an exemplary embodiment of the inventive concept. Like reference numerals in FIGS. 1 to 27 denote like elements. Hereinafter, to simplify the description, substantially the same contents as those described in FIGS. 1 to 20 will be omitted.

Figure 21:
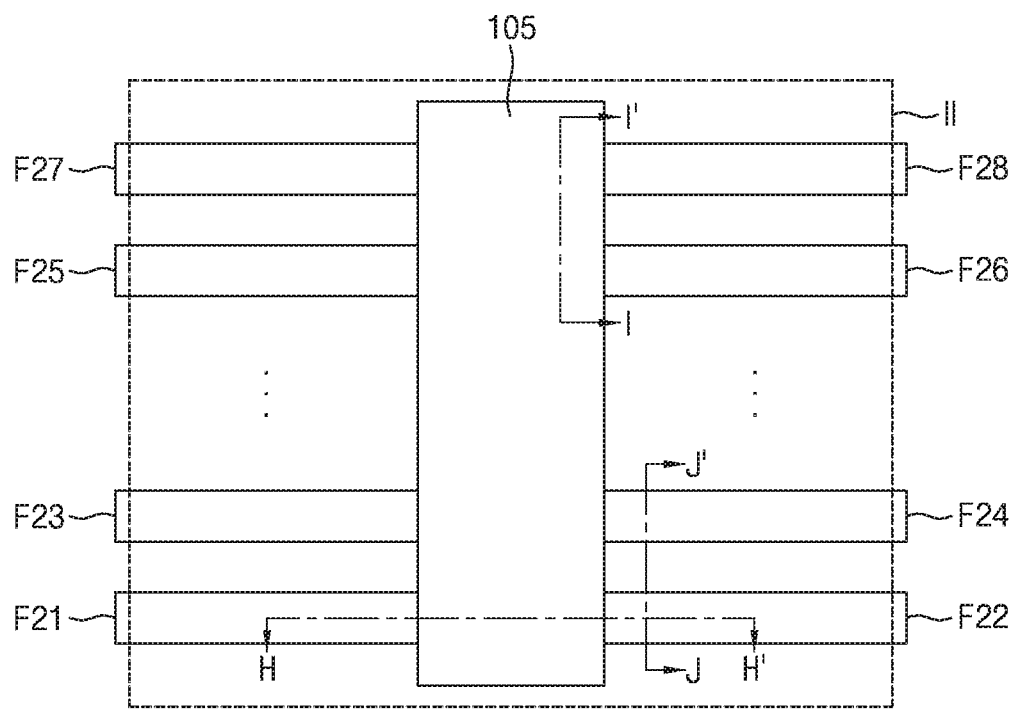
FIG. 21 is a plan view of a semiconductor device according to an embodiment of the inventive concept.
Figure 22:
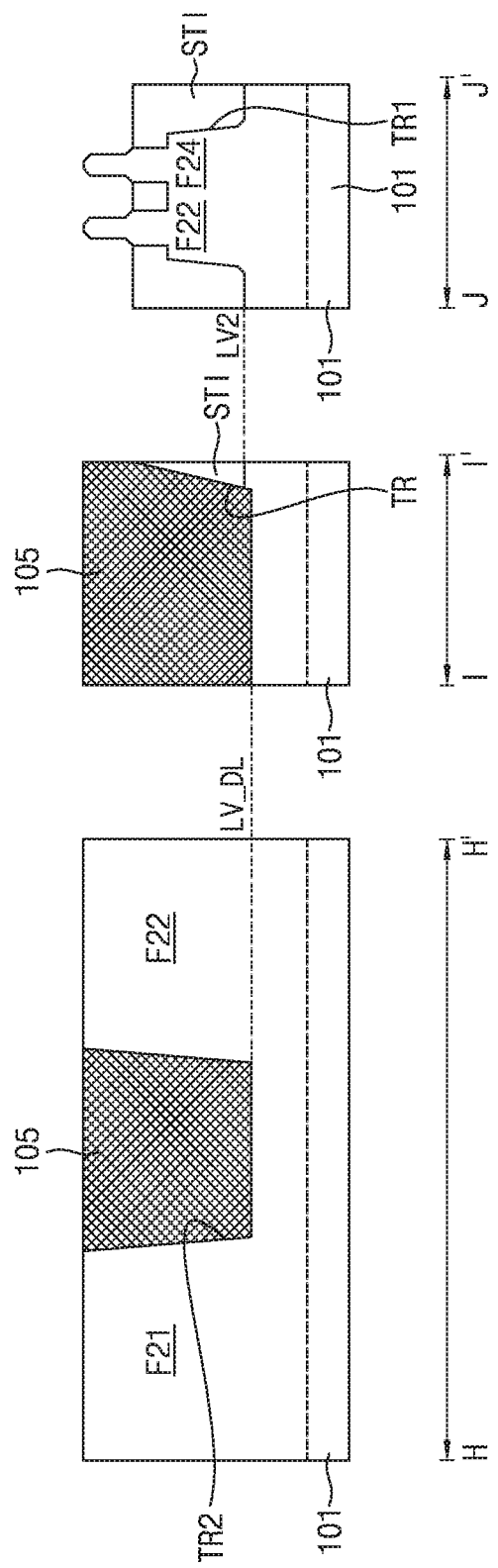
FIG. 22 is a cross-sectional view of the device of FIG. 21 at an intermediate stage of fabrication, taken along lines H-H', I-I' and J-J'.

Referring to FIGS. 21 and 22, a first trench TR1 and a second trench TR2 may be formed on a substrate 101. In one exemplary embodiment, a plurality of first trenches TR1 may extend to be parallel to each other in a second direction. Further, a plurality of second trenches TR2 may be spaced apart from each other in a first direction and may extend to be parallel to each other in the first direction. A level LV_DL of a lower end of the second trench TR2 may be lower than a level LV2 of a lower end of the first trench TR1.

As the first trench TR1 and the second trench TR2 are formed, fins F21 to F28, which protrude upward from the substrate 101 in a direction perpendicular to a main surface of the substrate 101 and extend in the first direction, may be formed.

After the fins F21 to F28 are formed, a device isolation layer STI filling the first trench TR1 and a first diffusion break region 105 filling the second trench TR2 may be formed. The device isolation layer STI may be formed of a material including at least one of an oxide and an oxynitride. Further, the first diffusion break region 105 may be formed of a material including at least one of an oxide, a nitride, and an oxynitride. Levels of upper surfaces of the device isolation layer STI and the first diffusion break region 105 may match each other, but the inventive concept is not limited thereto.

Figure 23:
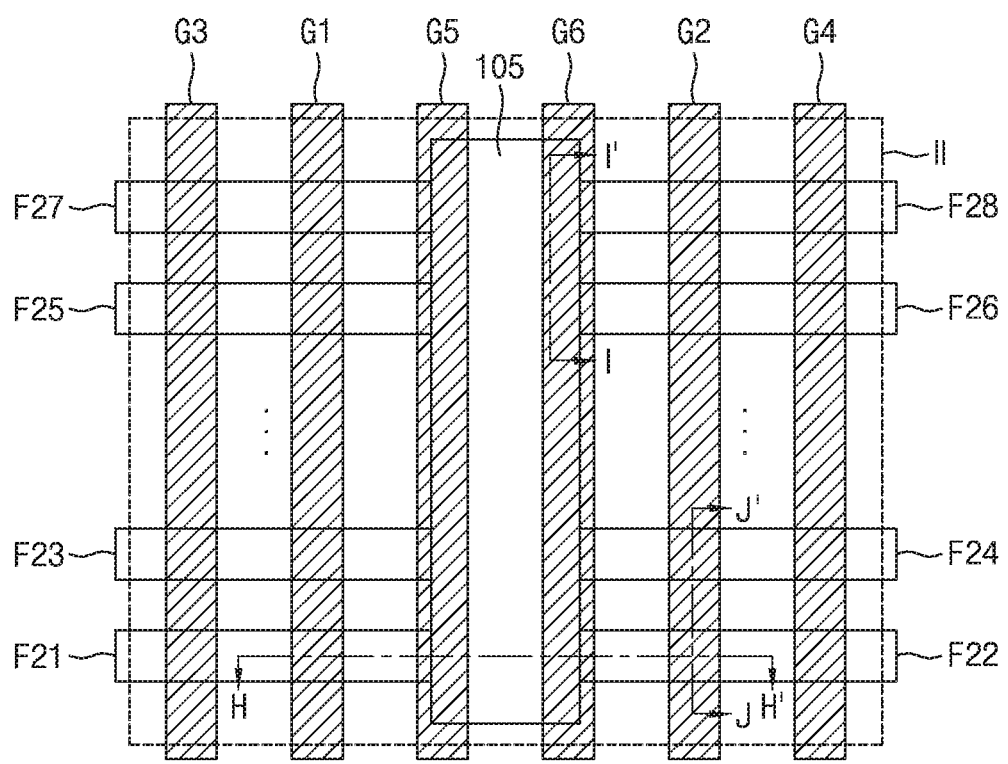
FIG. 23 is a plan view of a semiconductor device according to an embodiment of the inventive concept.
Figure 24:
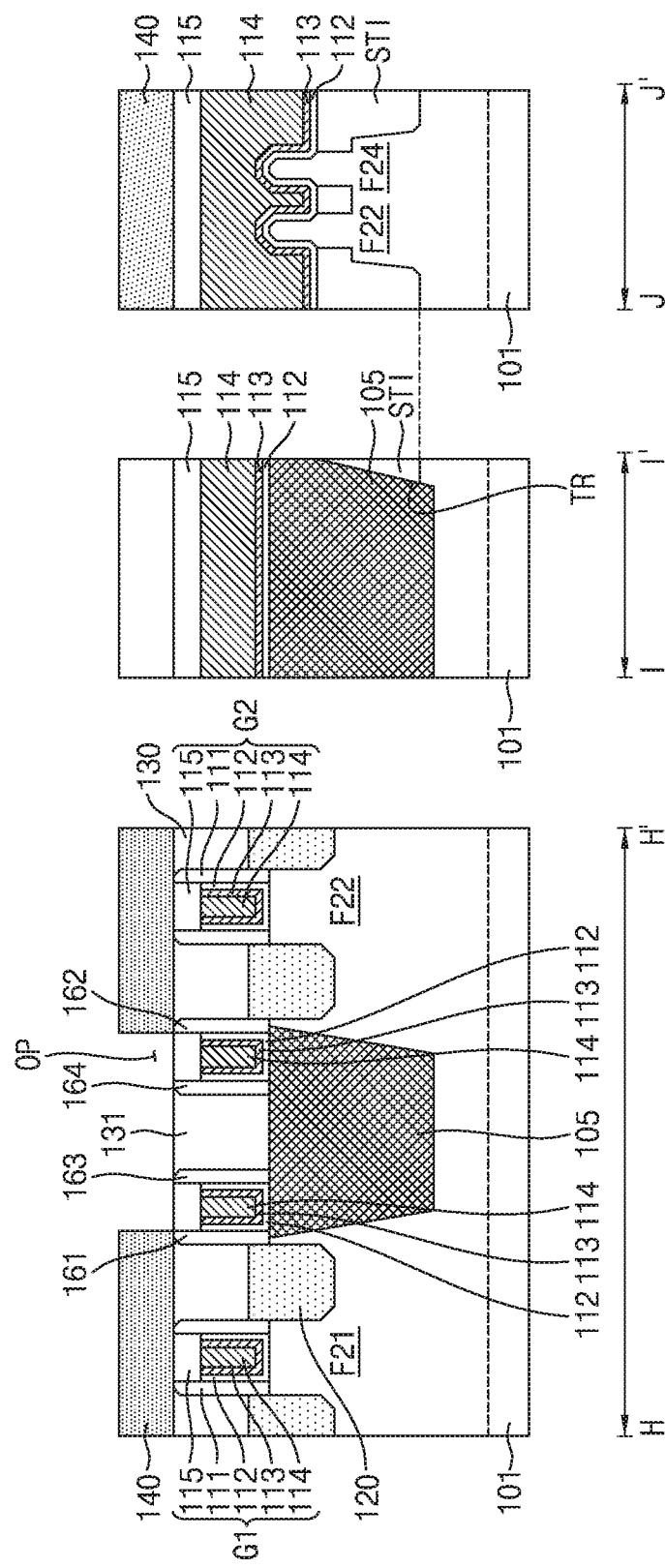
FIG. 24 is a cross-sectional view of the device of FIG. 23 at an intermediate stage of fabrication, taken along lines H-H', I-I' and J-J'.

Referring to FIGS. 23 and 24, after the fins, the device isolation layer STI, and the first diffusion break region 105 are formed on the substrate 101, preliminary fins F1 to F4, gate structures G1 to G4, sacrificial gate structures G5 and G6, source/drain regions 120, the device isolation layer STI, and an interlayer insulating layer 130 may be formed. The gate structures G1 to G4 and the sacrificial gate structures G5 and G6 may be formed by a gate replacement process.

In one exemplary embodiment, the sacrificial gate structures G5 and G6 may be formed on the first diffusion break region 105. Heights of the fifth gate structure G5 and the sixth gate structure G6 formed on the first diffusion break region 105 may be equal to heights of the gate structures G1, G2, G3, and G4 formed on the fins F21 to F28. However, the inventive concept is not limited thereto, and the heights of the fifth gate structure G5 and the sixth gate structure G6 formed on the first diffusion break region 105 may be higher or lower than the heights of the gate structures G1 to G4.

Next, a mask layer 140 may be formed on the gate structures and the interlayer insulating layer 130 like that shown in FIG. 18B. An open region OP of the mask layer 140 may be formed in the same manner as in FIG. 18B. For example, the open region OP of the mask layer 140 may be formed to be aligned with one sidewall of the fifth gate structure G5 and at one sidewall of the sixth gate structure G6 facing the one sidewall of the fifth gate structure G5.

Figure 25:
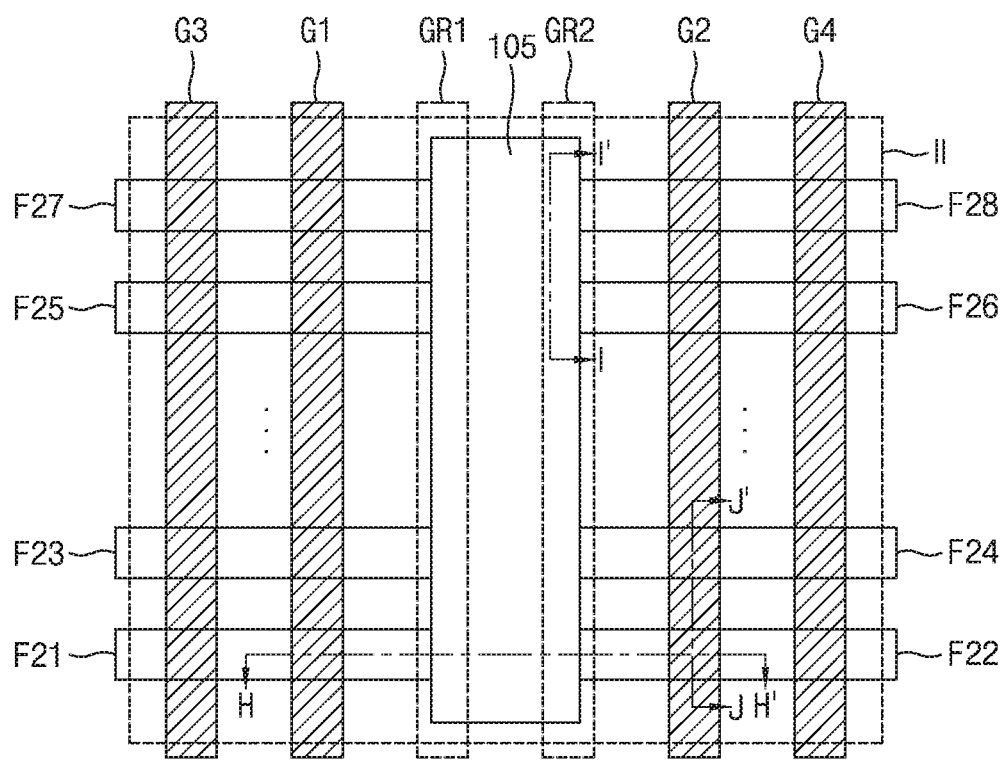
FIG. 25 is a plan view of a semiconductor device according to an embodiment of the inventive concept.
Figure 26:
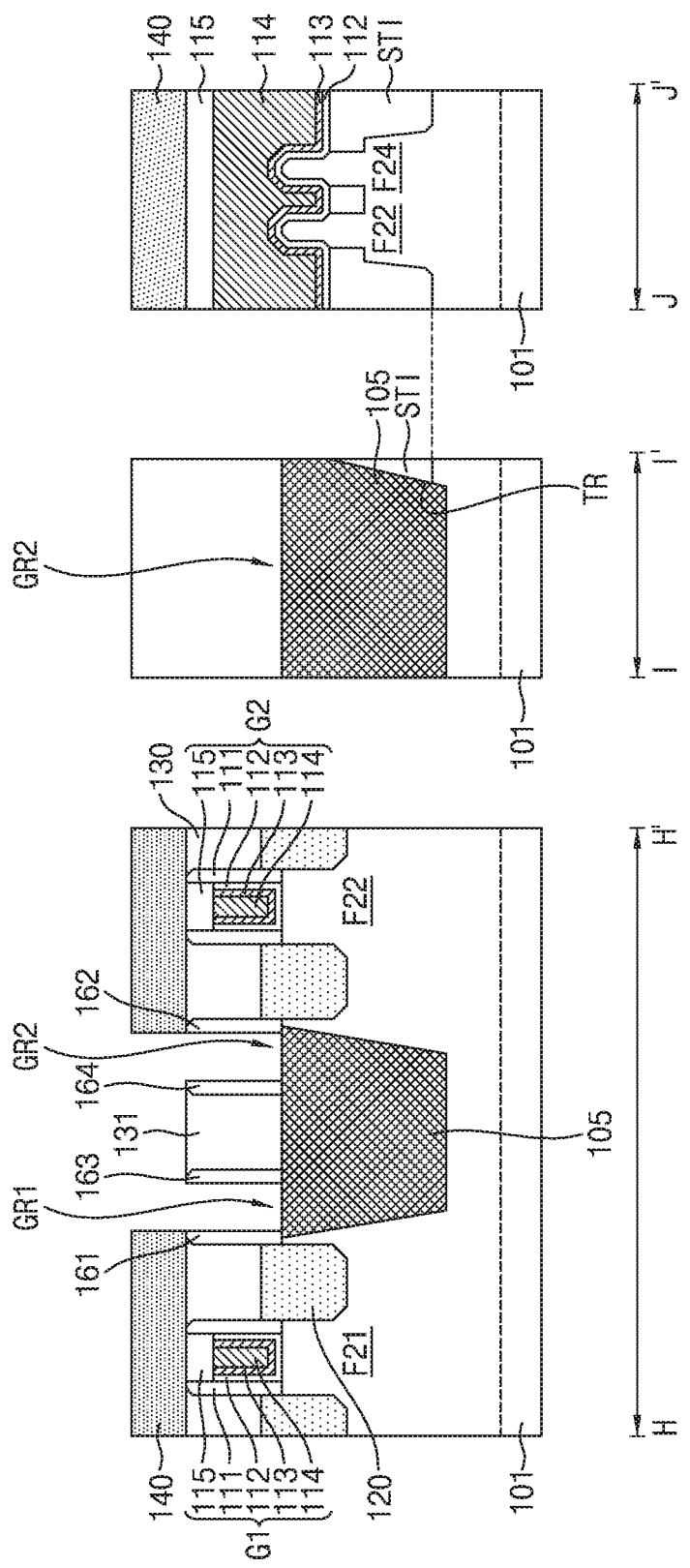
FIG. 26 is a cross-sectional view of the device of FIG. 25 at an intermediate stage of fabrication, taken along lines H-H', I-I' and J-J'.

Referring to FIGS. 25 and 26, a gate capping layer 115, gate electrodes 113 and 114, and a gate insulating layer 112 of the fifth gate structure G5 and the sixth gate structure G6 may be sequentially etched and removed through the open region OP like those shown in FIGS. 18A and 18B. By removing the gate capping layer 115, the gate electrodes 113 and 114, and the gate insulating layer 112, gate recesses GR1 and GR2 may be formed between spacers 161 to 164. An upper surface of the first diffusion break region 105 may be exposed through the gate recesses GR1 and GR2.

Figure 27:
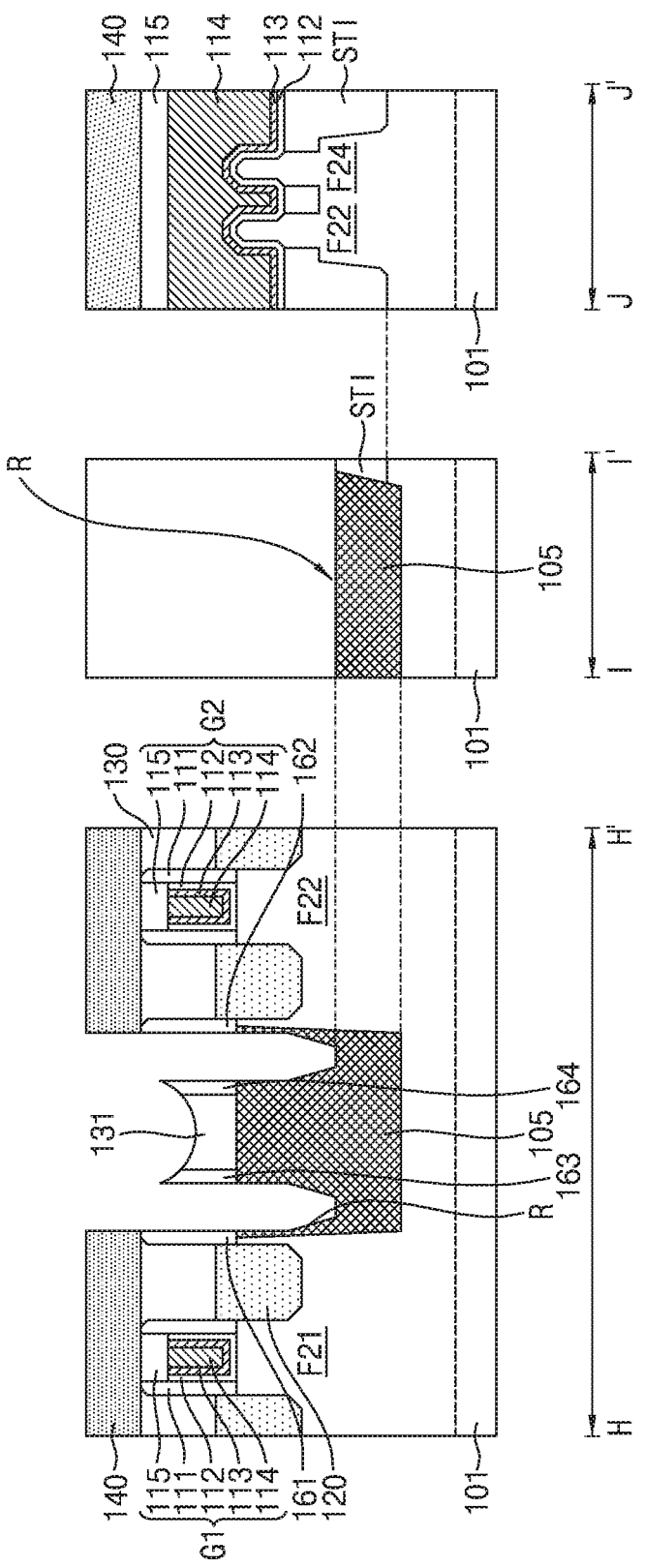
FIG. 27 is a cross-sectional view of the device of FIG. 25 at an intermediate stage of fabrication, taken along lines H-H', I-I' and J-J'.

Referring to FIG. 27, the first diffusion break region 105 is partially etched through the gate recesses GR1 and GR2 so that recesses R in the first diffusion break region 105 may be formed. The recesses R may extend in the second direction along the first diffusion break region 105.

In the process of etching the first diffusion break region 105, an etch material having a high etch selectivity ratio with respect to the first diffusion break region 105 may be used. In one exemplary embodiment, the first diffusion break region 105 may be etched by anisotropic etching. Portions of the spacers 161 to 164 and a portion of an interlayer insulating layer 131 formed on the first diffusion break region 105 may be etched together with the first diffusion break region 105 by the anisotropic etching. As a result, an upper surface of the interlayer insulating layer 131 may be formed to have a U-shape. Further, heights of the spacers 163 and 164 on the first diffusion break region 105 may be lower than heights of the spacers 163 and 164 on the first fins F11', F21', F31', and F41' and the second fins F12', F22', F32', and F42'. A height of the interlayer insulating layer 130 on the first diffusion break region (105) may be lower than a height of the interlayer insulating layer 131 on the first fins F11', F21', F31', and F41' and the second fins F12', F22', F32', and F42'.

Next, a second diffusion break region 150 may be formed on the first diffusion break region 105, the interlayer insulating layer 131, and the spacers 162 and 163 so that the semiconductor device like that shown in FIG. 11 may be formed.

Although not shown in the drawing, the spacers 163 and 164 and the interlayer insulating layer 131, which are formed on the first diffusion break region 105, may be etched by additionally performing anisotropic etching like those shown in FIG. 27. Further, depths of the recesses R of the first diffusion break region 105 may be increased by the additional performance of the anisotropic etching. The additional performance of the anisotropic etching may be performed until the level of the upper surface of the interlayer insulating layer 131 becomes lower than the level of the upper surfaces of the first fins F11', F21', F31', and F41' and the second fins F12', F22', F32', and F42'. In one exemplary embodiment, the upper surface of the interlayer insulating layer 131 may be formed to have an inverted U-shape.

Next, the second diffusion break region 150 may be formed on the first diffusion break region 105, the interlayer insulating layer 131, and the spacers 163 and 164 so that the semiconductor device like that shown in FIG. 12 may be formed.

The spacers 163 and 164 and the interlayer insulating layer 131, which are formed on the first diffusion break region 105, may be removed by additionally performing anisotropic etching. Further, the first diffusion break region 105 between the recesses R is partially etched so that a wide and deep trench may be formed.

Next, the second diffusion break region 150 may be formed in the wide and deep trench formed on the first diffusion break region 105 so that the semiconductor device like that shown in FIG. 13 may be formed.

According to the exemplary embodiments of the inventive concept, a diffusion break region can be provided according to a current characteristic of an NMOS transistor and a voltage characteristic of a PMOS transistor of a semiconductor device having a fin-FET. A semiconductor device in which performance thereof is improved and an electrical characteristic thereof is improved according to a diffusion break region provided in NMOS and PMOS regions can be implemented.

While the embodiments of the present inventive concept have been described with reference to the accompanying drawings, it should be understood by those skilled in the art that various modifications may be made without departing from the scope of the present inventive concept and without changing essential features thereof. Therefore, the above-described embodiments should be considered in a descriptive sense only and not for purposes of limitation.

What is claimed is:

1. A semiconductor device, comprising:
   first and second fins extending in a first direction and spaced apart from each other in the first direction on a substrate;
   a third fin having a long side shorter than respective long sides of the first and second fins, extending between the first and second fins;
   a first gate structure formed to extend in a second direction different from the first direction and cross over the first fin;
   a device isolation layer disposed on a lower sidewall of each of the first, second and third fins and extending in the first direction; and
   a diffusion break region extending in the second direction on the device isolation layer, said diffusion break region comprising a first portion, which crosses between the first fin and the third fin, a second portion, which crosses between the second fin and the third fin, and a third portion, which is disposed between the first portion and the second portion and on the third fin;
   wherein a level of a lower surface of the third portion is higher than a level of a lower end of each of the first portion and the second portion and is lower than a level of an upper surface of the first gate structure.

2. The semiconductor device of claim 1, wherein the lower surface of the third portion is formed to have a U-shape; and wherein a level of a lower end of the lower surface of the third portion is higher than a level of an upper surface of the first fin.

3. The semiconductor device of claim 1, wherein the level of the lower end of the first portion and the level of the lower end of the second portion match a level of a lower end of the device isolation layer or are lower than the level of the lower end of the device isolation layer, between the first fin and the second fin.

4. The semiconductor device of claim 1, further comprising:
   inner spacers in contact with one side surface of the first portion and one side surface of the second portion, which faces the one side surface of the first portion; and
   outer spacers in contact with another side surface of the first portion and another side surface of the second portion.

5. The semiconductor device of claim 4, wherein heights of the outer spacers are higher than heights of the inner spacers; and wherein upper ends of the inner spacers are in contact with the lower surface of the third portion.

6. The semiconductor device of claim 1, wherein a lower portion and an upper portion of the diffusion break region are made of different materials.

7. The semiconductor device of claim 1, wherein each of the first portion and the second portion further comprises a protrusion, having a width greater than a width between an outer spacer in contact with the first portion and an inner spacer in contact with the first portion, at a level lower than a level of an upper surface of the first fin.

8. The semiconductor device of claim 1, wherein the lower surface of the third portion is formed to have an inverted U-shape; and wherein a level of an upper end of the lower surface of the third portion is lower than or equal to a level of an upper surface of the first fin.

9. The semiconductor device of claim 1, further comprising one source/drain region formed on the third fin and disposed between the first portion and the second portion, and wherein the lower surface of the third portion is in contact with an upper surface of the source/drain region.

10. The semiconductor device of claim 1, wherein the diffusion break region comprises at least one of an oxide, a nitride, and an oxynitride.

11. A semiconductor device comprising:
   a first fin extending in a first direction on a substrate;
   a second fin extending in the first direction and spaced apart from the first fin in the first direction;
   a first gate structure extending in a second direction different from the first direction and extending across the first fin;
   a device isolation layer extending in the first direction and disposed on a lower sidewall of each of the first fin and the second fin;
   a diffusion break region extending in the second direction, across an area between the first fin and the second fin, said diffusion break region including lower and upper portions comprising different materials; and spacers disposed on both sidewalls of the diffusion break region;

wherein a width of a portion of the diffusion break region formed between the spacers is twice or more than a width of the first gate structure.

12. The semiconductor device of claim 11, wherein the diffusion break region further comprises a protrusion, having a width greater than the width of the portion of the diffusion break region formed between the spacers, at a level lower than a level of an upper surface of the first fin.

13. The semiconductor device of claim 11, wherein:

the diffusion break region comprises a first portion in contact with the first fin, a second portion in contact with the second fin, and a third portion formed to extend in a direction in which the first portion and the second portion face each other, and wherein a level of a lower end of the third portion is lower than a level of a lower surface of each of the first portion and the second portion.

14. A semiconductor device comprising:

a first fin extending in a first direction on a substrate;

a second fin extending in the first direction and spaced apart from the first fin in the first direction;

a device isolation layer disposed on a lower sidewall of each of the first fin and the second fin and formed to extend in the first direction;

a first diffusion break region extending in a second direction orthogonal to the first direction and crossing an area between the first fin and the second fin and over the device isolation layer; and a second diffusion break region overlapping the first diffusion break region and comprising portions extending into the first diffusion break region;

wherein the first diffusion break region comprises an oxide; wherein the second diffusion break region comprises a nitride; wherein the first diffusion break region is disposed in an n-channel metal-oxide-semiconductor (NMOS) device region of the substrate; and wherein the second diffusion break region is disposed in the NMOS device region and a p-channel metal-oxide-semiconductor (PMOS) device region of the substrate.

15. The semiconductor device of claim 14, wherein the second diffusion break region comprises, among the portions extending into the first diffusion break region, a first portion disposed closer to the first fin than the second fin and a second portion disposed closer to the second fin than the first fin.

16. The semiconductor device of claim 15, wherein the second diffusion break region comprises a third portion disposed between the first portion and the second portion, wherein a level of a lower surface of the third portion is higher than a level of an upper surface of the first diffusion break region.

17. The semiconductor device of claim 16, wherein the level of the lower surface of the third portion is higher than a level of an upper surface of the first fin.

18. The semiconductor device of claim 16, wherein the level of the lower surface of the third portion is lower than a level of an upper surface of the first fin.

* * * * *